US007532173B2

(12) United States Patent
Yamazaki et al.

(10) Patent No.: US 7,532,173 B2
(45) Date of Patent: May 12, 2009

(54) DISPLAY DEVICE AND FOLDING PORTABLE TERMINAL

(75) Inventors: Shunpei Yamazaki, Tokyo (JP); Yasuyuki Arai, Kanagawa (JP); Yasuko Watanabe, Kanagawa (JP); Aya Anzai, Kanagawa (JP); Hiromichi Godo, Kanagawa (JP); Junichiro Sakata, Kanagawa (JP); Kaoru Tsuchiya, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 942 days.

(21) Appl. No.: 10/788,255

(22) Filed: Feb. 27, 2004

(65) Prior Publication Data

US 2005/0024339 A1 Feb. 3, 2005

(30) Foreign Application Priority Data

| Feb. 28, 2003 | (JP) | ............................. 2003-054268 |
| Oct. 28, 2003 | (JP) | ............................. 2003-367483 |

(51) Int. Cl.
*G09G 5/00* (2006.01)
(52) U.S. Cl. ............................. 345/1.1; 345/32; 257/88; 348/52
(58) Field of Classification Search .................. 345/1.1, 345/32, 33, 34, 44, 55; 455/566; 348/52; 359/465; 257/88, 98
See application file for complete search history.

(56) References Cited

U.S. PATENT DOCUMENTS

| 5,396,406 | A | * | 3/1995 | Ketchpel ...................... 362/27 |
| 6,011,580 | A | * | 1/2000 | Hattori et al. ................. 348/57 |
| 6,621,508 | B1 | * | 9/2003 | Shiraishi et al. ............. 715/810 |
| 6,970,144 | B1 | * | 11/2005 | Swift et al. ................... 345/1.1 |
| 7,034,451 | B2 | | 4/2006 | Senbonmatsu |
| 7,139,053 | B2 | * | 11/2006 | Yuuki et al. .................. 349/114 |
| 7,161,185 | B2 | | 1/2007 | Yamazaki et al. |
| 7,327,335 | B2 | | 2/2008 | Yamazaki et al. |
| 2004/0169624 | A1 | | 9/2004 | Yamazaki et al. |

FOREIGN PATENT DOCUMENTS

JP  09-127885  5/1997

(Continued)

OTHER PUBLICATIONS

International Search Report (Application No. PCT/JP2004/001809, in Japanese), May 25, 2004, 3 pages.

(Continued)

*Primary Examiner*—Abbas I Abdulselam
(74) *Attorney, Agent, or Firm*—Fish & Richardson P.C.

(57) ABSTRACT

It is an object to provide a highly functioned and highly value-added display device and mobile terminal. It is another object to provide a display device and mobile terminal characterized by including a plurality of pixels arranged in a matrix form and a first display screen over one surface of a substrate having a translucency, a second display screen over the opposite surface of the one surface of the substrate, each of the plurality of pixels having a light emitting element for emitting light toward the first display screen and the second display screen, and a first polarizer over one surface of the substrate and a second polarizer over the opposite surface of the one surface of the substrate.

34 Claims, 16 Drawing Sheets

FOREIGN PATENT DOCUMENTS

| | | |
|---|---|---|
| JP | 10-255976 | 9/1998 |
| JP | 2001-086205 | 3/2001 |
| JP | 2001-385445 | 10/2001 |
| JP | 2001-332392 | 11/2001 |
| JP | 2001-343908 | 12/2001 |
| JP | 2001-356714 | 12/2001 |
| JP | 2002-156920 | 5/2002 |
| JP | 2003-058069 | 2/2003 |
| JP | 3408154 | 3/2003 |
| JP | 3408154 | 5/2003 |

OTHER PUBLICATIONS

Written Opinion ((Application No. PCT/JP2004/001809, in Japanese w/Partial Translation), May 25, 2004, 6 pages.

Exhibition of Active Matrix Type Organic EL Display at "13th Flat Panel Display Manufacturing Technology Expo & Conference," by ELDis Group (*in Japanese with full translation*); Jul. 2, 2003.

Documents distributed in the "13th Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

\* cited by examiner (A)

(B)

IMAGE OF ANIMAL | IMAGE OF BACKGROUND (C)

| ANODE SIDE | thickness (nm) | CATHODE SIDE | thickness (nm) |
|---|---|---|---|
| 0th LAYER (EML, LIGHT EMITTING LAYER) | 0 | 0th LAYER (EML, LIGHT EMITTING LAYER) | 0 |
| 1st LAYER (HTL/HIL) | 33 | 1st LAYER (ETL/EIL) | 90 |
| 2nd LAYER (ITO) | 110 | 2nd LAYER (Ag) | 8 |
| ※3rd LAYER (SP-SiN) | 100 | 3rd LAYER (ITO) | 260 |
| ※4th LAYER (ACRYLIC) | 1000 | 4th LAYER (SP-SiN) | 100 |
| ※5th LAYER (SiNO) | 100 | 5th LAYER (AIR) | 0 |
| ※6th LAYER (GI) | 110 | GLASS SUBSTRATE | — |
| ※7th LAYER (SiON) | 100 | | |
| ※8th LAYER (SiNO) | 50 | | |
| GLASS SUBSTRATE | — | | |

※ TFT PORTION

DISPLAY DEVICE AND FOLDING PORTABLE TERMINAL

TECHNICAL FIELD

The invention relates to a portable terminal such as a mobile telephone and a personal digital assistant (PDA), and more specifically, it relates to a mobile terminal including a light emitting element and having a double-sided display panel having display screens on the front and back.

The invention further relates to a display device having display screens on the front and back. The invention further relates to a display device having an image sensor function and having display screens on the front and back.

BACKGROUND ART

In recent years, instead of a liquid crystal display (LCD) having pixels using liquid crystal elements, a light-emitting apparatus using a light emitting element typically such as an electro-luminescence (EL) element has been studied and developed as a light-emitting apparatus. The light-emitting apparatus is widely used as a display screen of a mobile terminal by taking advantage of high quality and wide viewing angles based on the light-emitting function and thinness and light-weight, and so forth based on the unnecessity of backlights.

Because of the application divestment, highly value-added mobile terminals have been demanded. Recently, it has been provided which includes a sub-display screen on the back of a normal display screen (refer to Patent Document 1, for example).

(Patent Document 1) Japanese Patent Application Laid-Open No. 2001-285445

Among mobile terminals, a so-called foldable mobile telephone in which first and second housings are connected through a hinge is the mainstream of the market.

DISCLOSURE OF THE INVENTION (Problems that the Invention is to Solve)

A mobile terminal including a sub-display screen in addition to an original display screen has a volume of a module including a backlight, for example, and an unignorable volume of a substrate having a control IC, for example, for driving it. Especially, mobile terminals having significantly reduced weight, thickness, length and size have been recently available, which trade off the demand for height value addition.

Furthermore, in a foldable mobile terminal including a sub-display screen, a first display screen and a second display screen are disposed on the front and back on a back-to-back basis. Thus, though two display screens are provided, exclusively one of them can be used when the mobile telephone is opened or closed. In order to check the internal display screen, the mobile telephone must be opened, which may be inconvenient.

Further, the mobile communication market is apparently stagnating since the number of new subscriptions to mobile telephone services is continuously decreasing. Therefore, much higher functions and value-addition are demanded for functions of a mobile telephone, which may largely influence on the increase/decrease of the number of new subscriptions and/or selection of machine types.

Accordingly, it is an object of the invention to provide a highly value-added mobile terminal using a modularizable panel having a small volume. It is another object of the invention to provide a foldable mobile terminal whose display screen can be viewed without opening/closing the mobile terminal. Further, it is another object of the invention to provide a highly functioned and highly value-added mobile terminal for the invigoration of the market. It is another object of the invention to provide a highly functioned and highly value-added display device.

(Means for Solving the Problems)

In order to solve these problems, the invention institutes following measures.

The invention is characterized by being a foldable mobile terminal in which a first housing having a double-sided display panel and a second housing having operation buttons are connected through a hinge. The double-sided display panel is characterized in that has a plurality of pixels arranged in a matrix form and a first display screen over one surface of a substrate having a translucency and a second display screen over the opposite surface of the one surface of the substrate, and each of the a plurality of pixels has a light emitting element which emit light toward the first display screen and the second display screen.

As another construction, the double-sided display panel is characterized in that has a plurality of first pixels arranged in a matrix form and a first display screen over one surface of a substrate having a translucency and a plurality of second pixels arranged in a matrix form and a second display screen over the opposite surface of the one surface of the substrate and each of the a plurality of first and second pixels has a light emitting element which emit light toward the first display screen and the second display screen.

Further, as another construction, the double-sided display panel is characterized in that has a plurality of pixels arranged in a matrix form and a first display screen over one surface of a substrate having a translucency and a second display screen over the opposite surface of the one surface of the substrate, each of the plurality of pixels has a light emitting element which emit light toward the first display screen and the second display screen and an optoelectronic transducer. In a mobile terminal having this construction, the light-emitting element plays two roles including a role as a light source to be used for reading information on a subject and a role of displaying images. The double-sided display panel has two functions including an image sensor function for reading information on a subject and a display function for displaying images.

The invention is characterized by being a mobile terminal including a plurality of double-sided display panels in a first housing. The plurality of panels are characterized by displaying different kinds of information from each other. Because of the characteristic, three-dimensional images can be displayed on the display screen, and a plurality of images including a warning display and a normal display, for example, can be displayed one over another. When three double-sided display panels are provided in the first housing, the first double-sided display panel has a red display element, the second double-sided display panel has a green display element and the third double-sided display panel has a blue display element. Thus, color images can be displayed.

The invention is characterized in that the first housing includes a double-sided display panel and a microphone and the second housing includes operation buttons and a speaker. Thus, it is preferably operated by putting the second housing having the speaker to the ear and putting the first housing having the microphone to the mouth.

The invention is characterized by having polarizers over one surface of the double-sided display panel and the opposite surface of the one surface. Under this construction, surroundings are not seen through since the double-sided display panel itself is no longer transparent.

The invention having the above-described construction can provide a mobile terminal having a reduced size by using a double-sided display panel having display screens on the front and back, by which the display screen can be viewed without opening or closing the mobile terminal. Therefore, a more highly functioned and highly value-added mobile terminal can be provided.

The light emitting element has a first electrode having a translucency, on the first electrode, a layer including organic compounds emitting red, green and blue lights, and a second electrode having a translucency on the layer including the organic compounds, and one or more factors selected from transmittances, absorption coefficients and reflectivities of light through the first electrode and light through the second electrode are identical with each other. Because of the above characteristic, a display device and mobile terminal can be provided, which can achieve a uniform tone in light emission to the upper surface through the anode and light emission to the lower surface through the cathode and high quality image display.

The invention is characterized by providing a display device including a plurality of pixels arranged in a matrix form and a first display screen over one surface of a substrate having a translucency, a second display screen over the opposite surface of the one surface of the substrate, each of the plurality of pixels having a light emitting element for emitting light over the one surface of the substrate and the opposite surface of the one surface of the substrate, and a first polarizer over the one surface of the substrate and a second polarizer over the opposite surface of the one surface of the substrate. The invention is further characterized by including one or both of a first ½ wave plate and a first ¼ wave plate over one surface of the substrate and one or both of a second ½ wave plate and a second ¼ wave plate over the opposite surface of the one surface of the substrate. When a red light emitting element having a peak at 620 nm, a green light emitting element having a peak at 530 nm and a blue light emitting element having a peak at 450 nm are used, for example, one or more factors selected from transmittances, reflectivities and absorption coefficients of the cathode side and the anode side can be identical or be substantially identical by adjusting the thickness of a laminate constituting the light emitting elements. Then, by using values of the one or more factors selected from the transmittances, reflectivities and absorption coefficients, calculate chromaticity coordinates of red, green and blue. In a chromaticity diagram, three chromaticity coordinates of blue, green and blue between the cathode side and the anode side forms the same or substantially the same triangles. Thus, high quality image display can be obtained having a uniform tone both light emitted to the upper surface and light emitted to the lower surface. Furthermore, clearer black display and higher contrast can be achieved. A display device according to the invention includes a panel (double-sided display panel) in which a light emitting element is sealed between a substrate and a cover member, a module having IC and so on implemented in the panel and a display having a function for displaying images. In other words, the display device corresponds to a generic name of the panel, module, display and so on.

(Advantage of the Invention)

The invention having the above-described construction can provide a mobile terminal having a reduced size by using a double-sided display panel having display screens on the front and back, whose display screen can be viewed without opening or closing the mobile terminal. Therefore, a more highly functioned and highly value-added mobile terminal can be provided.

By using a double-sided display panel, a novel design can be achieved, and a highly value-added mobile terminal can be provided. The double-sided display panel can provide display having high viewability from all directions, high contrast ratio and high display quality and is self-luminous. Thus, a light source such as a backlight is not required, and a thin panel can be provided. Therefore, it is especially effective for a mobile terminal.

Furthermore, by using a double-sided display panel including display screens on the front and back, a highly-functioned and highly value-added display device can be provided.

BRIEF DESCRIPTION OF THE DRAWINGS

FIG. 12 is a diagram showing thicknesses of layers to be laminated in the EL element.

BEST MODE FOR CARRYING OUT THE INVENTION

Figure 1:
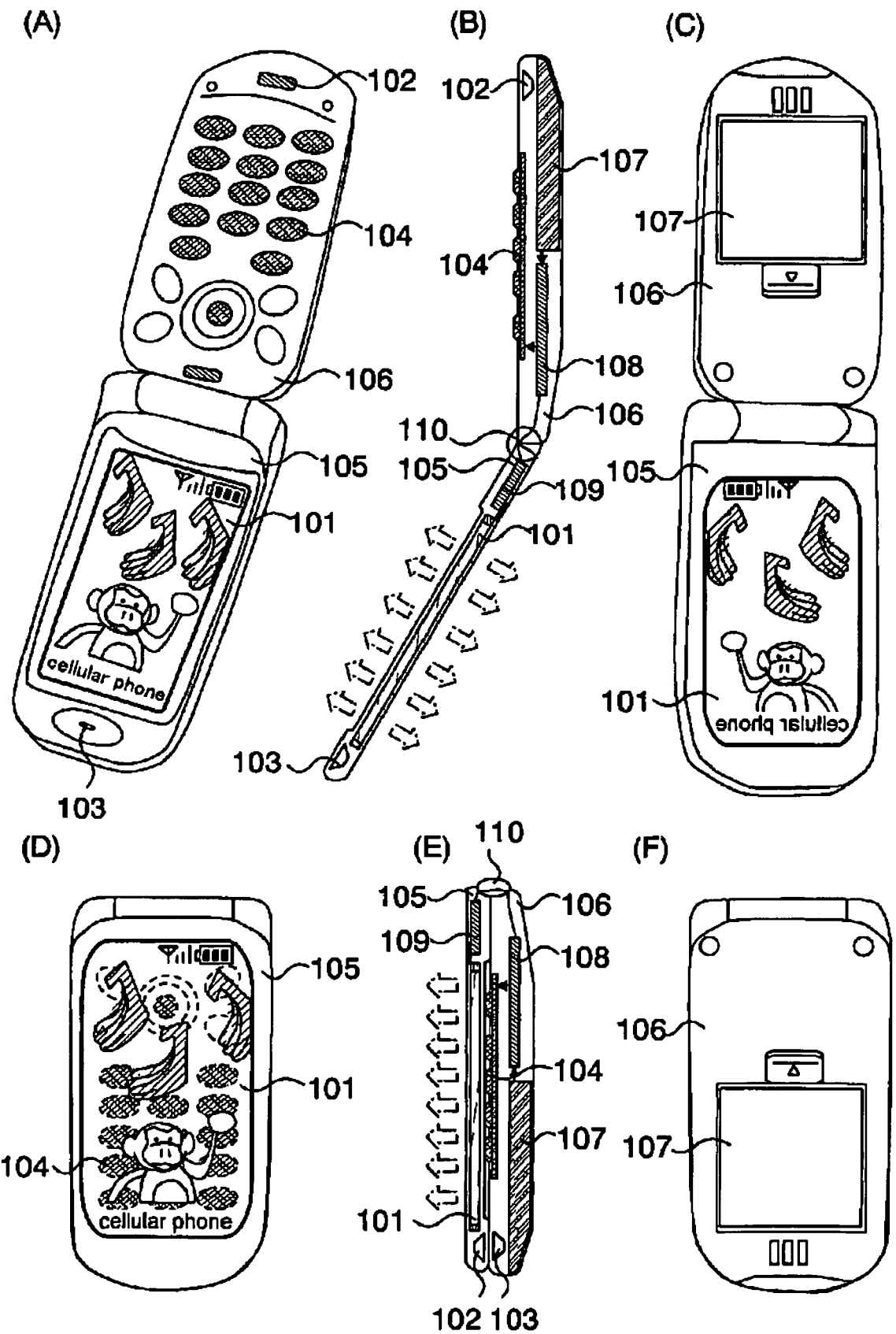
FIG. 1 is a diagram illustrating a foldable mobile terminal of the invention.

This embodiment of the invention will be described in detail with reference to the drawings. However, the invention is not limited to the following description. It is easily understood by those skilled in the art that the form and details can be changed without departing from the spirit and scope of the invention. It is to be understood that the invention is not limited to the specific embodiments thereof, which will be described below. For example, according to this embodiment, a mobile telephone among mobile terminals is provided. However, the invention can be easily applied to other mobile terminals such as a PDA and a laptop personal computer. In the following description of a construction of the invention, same reference numerals given to same components are used in different drawings. While, in one embodiment below, a thin-film transistor (TFT) is used as a switch element and/or a drive element, the invention is not particularly limited thereto. For example, a MOS transistor, an organic transistor, a molecule transistor or the like may be used similarly.

Embodiment 1

A detail construction of a mobile telephone according to a first embodiment as a mobile terminal to which the invention is applied will be described with reference to FIG. 1. FIGS. 1(A) to (F) include a double-sided display panel 101, a speaker 102 functioning as a receiver, a microphone 103 functioning as a transmitter, operation buttons 104 for operating the terminal, a first housing 105, a second housing 106, a battery 107 functioning as a power supply, a module 108 including an IC for driving the terminal, a module 109 for driving the double-sided display panel 101 and a hinge 110 for connecting the first housing 105 and the second housing 106 foldably. The terminal may include a camera having a shooting function and an antenna for receiving electromagnetic waves, which are not shown. The terminal may further include accessories such as a strap, an earphone/microphone and a stereo earphone set.

The invention is characterized in that the double-sided display panel 101 and the microphone 103 functioning as a transmitter are provided in one housing (that is, the first housing 105 here) and the operation buttons 104 and the speaker functioning as a receiver are provided in one housing (that is, the second housing 106 here). In other words, since the second housing 106 having the speaker 102 is put to the ear and the first housing 105 having the microphone 103 is put to the mouth, the terminal is operated by holding the second housing 106 upward and the first housing 105 downward. The operation buttons 104 are operated by facing the second housing 106 toward a user.

The invention is characterized by using the double-sided display 101. The double-sided display panel 101 has display screens over two surfaces including one surface of and the opposite surface of a substrate having a translucency. In other words, display screens are provided on the front and back of the substrate having a translucency, and images are displayed on the display screens. A plurality of pixels are provided to one or both of the front and back of the substrate having a translucency. A display element is provided to each of the plurality of pixels, and a self-luminous light emitting element is preferably used. That is, the double-sided display panel 101 used in the invention includes display elements emitting light toward the front and back of the substrate having a translucency and is also called a transparent display. Thus, when a material having a translucency is used in one or both of the first housing 105 and the second housing 106, the mobile terminal is a transparent-type mobile terminal, which may further improve the design appeal.

A user of the mobile terminal can simply view horizontally inverted display of the double-sided display panel 101 in some directions instead of a normal display. Thus, in two states that the first housing 105 and the second housing 106 are opened and are closed, an image displayed on the double-sided display panel 101 may be simply horizontally inverted by using a switch circuit in accordance with a command from a sensor or the operation buttons 104.

Furthermore, the invention is characterized by being foldable since the first housing 105 and the second housing 106 are connected through the hinge 110. Because of the characteristic, the size of the mobile terminal can be decreased and the size of the display screen can be increased.

FIGS. 1(A) to 1(C) show a state that the first housing 105 and the second housing 106 connected through the hinge 110 are opened. FIG. 1(A) is an internal view. FIG. 1(B) is a side view. FIG. 1(C) is an external view. In FIGS. 1(A) and 1(C), an image is displayed on the double-sided display panel 101. The images on the internal display screen shown in FIG. 1(A) are horizontally inverted on the external display screen shown in FIG. 1(C) since the front and back are disposed back to back. Being apparent from FIG. 1(B), the double-sided display panel 101 has display screens on the front and back.

FIGS. 1(D) to 1(F) show a state that the first housing 105 and the second housing 106 connected through the hinge are closed. FIG. 1(D) is a view from the first housing 105. FIG. 1(E) is a side view. FIG. 1(F) is a view from the second housing 106. As shown in FIG. 1(D), since the double-sided display panel 101 has a translucency, the operation buttons 104 included in the second housing 106 are visible.

Figure 2:
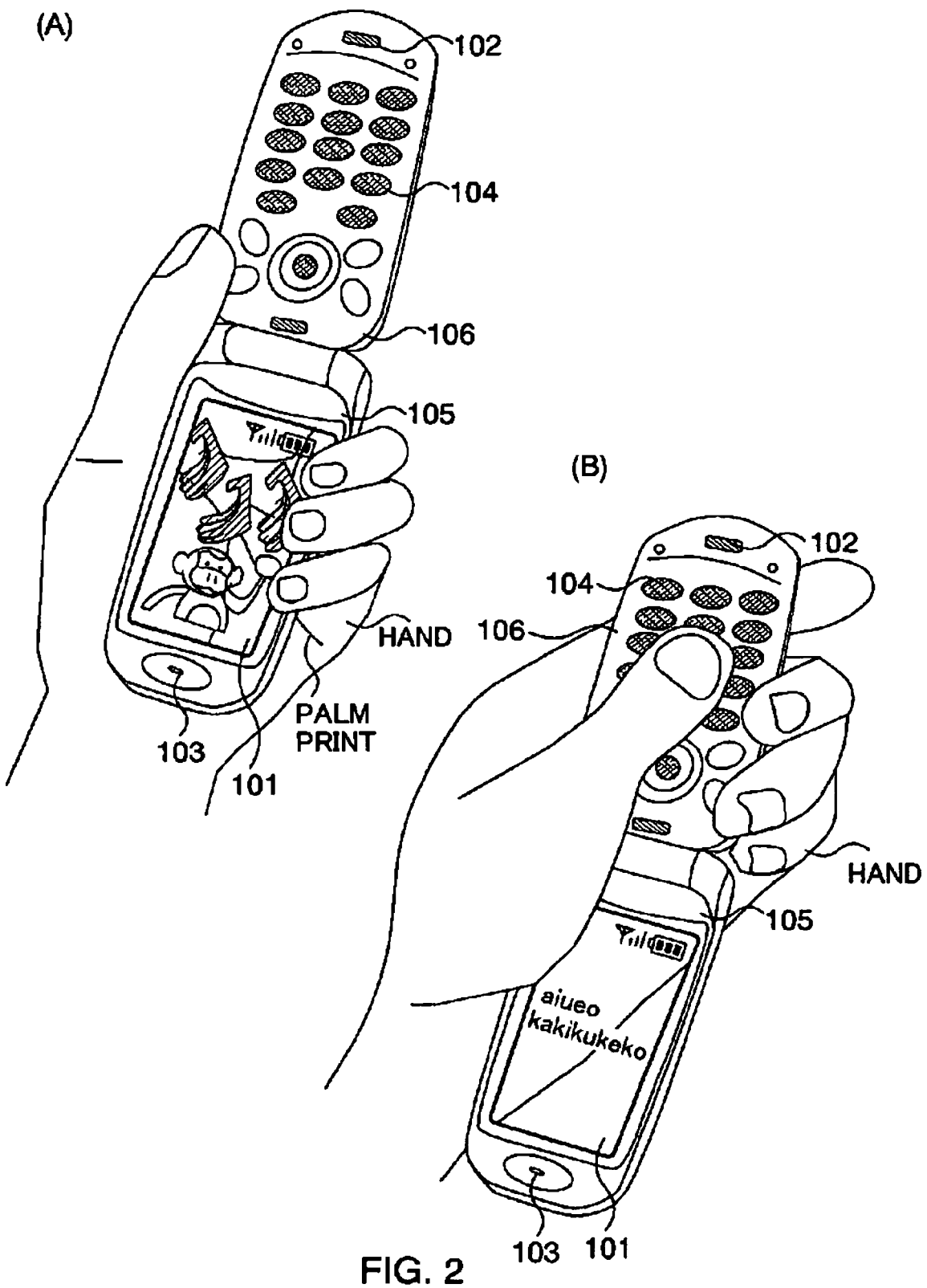
FIG. 2 is a diagram showing a way of using a foldable mobile terminal of the invention.

FIG. 2 shows a state that a user is actually operating the mobile terminal. FIG. 2(A) shows a state that the user is watching the double-sided display panel 101, and the palm print of the user is visible through the double-sided display panel 101. FIG. 2(B) shows a state that the user is operating the operation button 104, and the user's hand is visible through the double-sided display panel 101.

As shown in FIG. 2, since a user holds the mobile terminal by hand, the operation button 104 may be disposed on not only one face of the second housing 106 but also on the sides of the first housing 105 and second housing 106. Thus, the operation button 104 can be manipulated more easily. However, in order to prevent the operation buttons 104 disposed on the side from being manipulated unintentionally, a lock function therefor may be provided together.

The invention has a feature that the double-sided display panel 101 is used in a foldable mobile terminal. The double-sided display panel 101 can be hid by hand by holding the foldable mobile terminal as shown in FIG. 2(A). This way of holding is effective for privacy control since important information displayed on the double-sided display panel 101 is not exposed to other people. Furthermore, the operation buttons 104 can be manipulated easily by slightly moving hands, or even by one hand.

According to the invention having the above-described construction, a mobile terminal can be provided which has a reduced size by using a double-sided display panel including display screens on the front and back, whose display screens are visible without opening and closing the terminal. Therefore, a highly-functioned and highly value-added mobile terminal can be provided.

Embodiment 2

Figure 3:
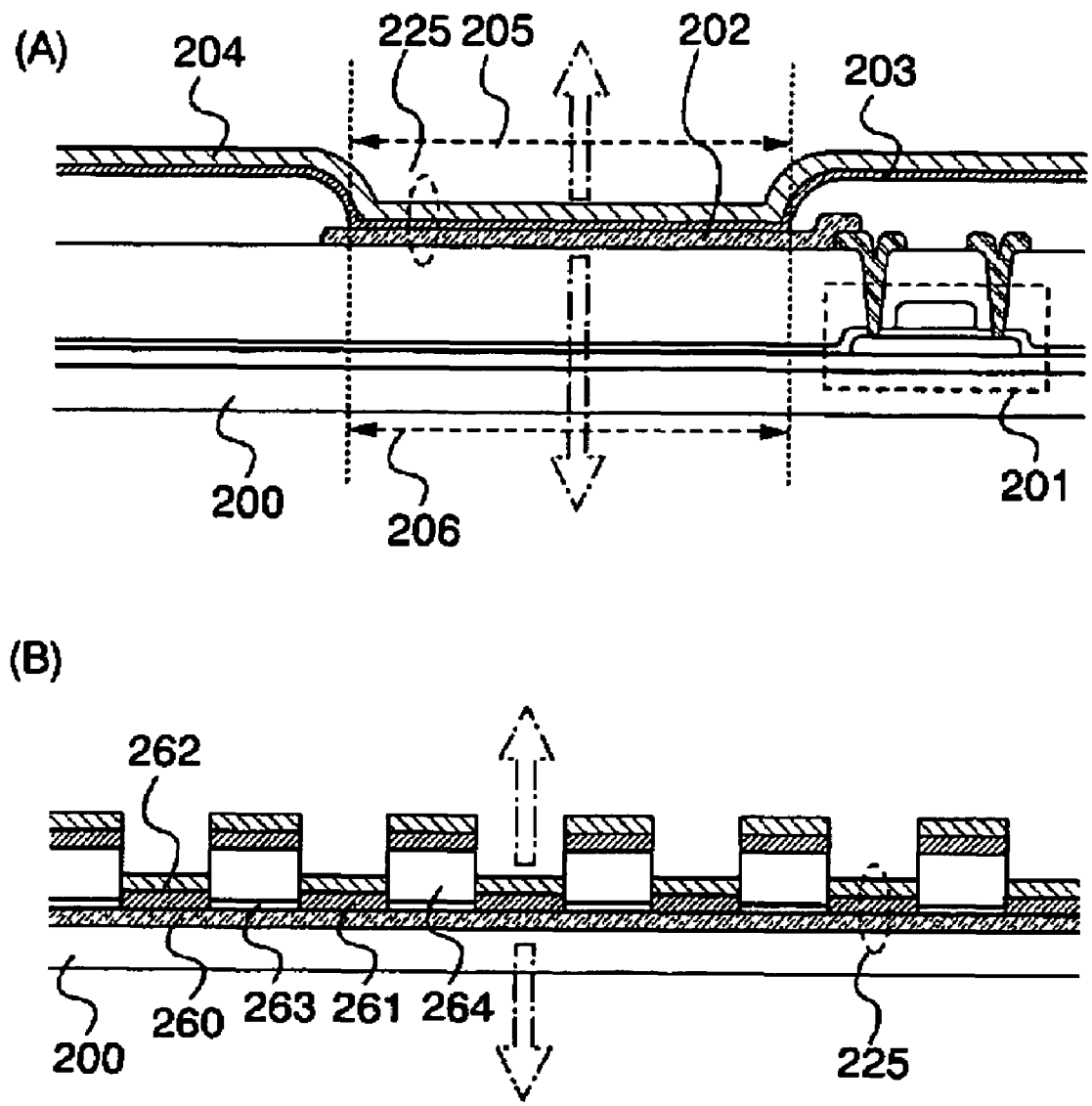
FIG. 3 is a section view of a double-sided display panel.

An embodiment of the invention will be described with drawings. A construction of a double-sided display panel 101 having first and second display screens according to this embodiment will be described in detail. FIG. 3(A) shows an active type using a transistor, and FIG. 3(B) shows a passive type.

In FIG. 3(A), a drive transistor 201, a first electrode (pixel electrode) 202, a light-emitting layer 203 and a second electrode (opposed electrode) 204 are provided over a substrate 200 having a translucency. A laminate of the first electrode 202, light emitting layer 203 and second electrode 204 corresponds to a light emitting element 225. The invention is characterized in that the first electrode 202 and second electrode 204 contain a material having a translucency. Thus, the light emitting element 225 emits light in a first direction toward the substrate 200 and in a second direction, which is opposite of the first direction, and has a first display area 205 and a second display area 206. A material having a translucency contained in the first electrode 202 and second electrode 204 refers to a transparent conductive film such as ITO (indium tin oxide) or one containing aluminum or the like having a thickness allowing light to pass through.

In FIG. 3(B), a first electrode (pixel electrode) 260, a light-emitting layer 261 and a second electrode (opposed electrode) 262 are provided over the substrate 200 having a translucency. A laminate of the first electrode 260, the light-emitting layer 261 and the second electrode 262 corresponds to the light emitting element 225. Furthermore, an insulating film 263 and resin film 264, which function as a bank, are provided.

In this way, the light-emitting layer 261 is provided between the electrodes in the passive type construction. The light-emitting layer 261 may contain a material mainly containing an inorganic material. In this case, an insulating layer may be provided between the first electrode 260 and the light-emitting layer 261 or between the second electrode 262 and the light-emitting layer 261. The insulating layer may have a structure resulting from alternately stacking of aluminum oxide ($Al_2O_3$) and titanium oxide ($TiO_2$) by thermal CVD using absorptive reaction of a deposition surface.

This embodiment can be freely combined with the above-described embodiment.

Embodiment 3

An embodiment of the invention will be described with reference to drawings. A construction of a double-sided display panel 101 having first and second display screens and further having an image sensor function according to this embodiment will be described in detail.

In FIG. 4(A), a drive transistor 201, a first electrode (pixel electrode) 202 containing a material having a translucency, a light-emitting layer 203 and a second electrode (opposed electrode) 204 containing a material having a translucency are provided over a substrate 200 having a translucency. A light emitting element 225 emits light in a first direction toward the substrate 200 and in a second direction, which is opposite of the first direction. An optoelectronic transducer 238 including a laminate of a P-type layer 231, an I-type (intrinsic) layer 232 and an N-type layer 233, an electrode 230 connecting to the P-type layer 231 and an electrode 234 connecting to the N-type layer 233 are provided over an insulating film 235 formed on the second electrode 204.

The double-sided display panel 101 having the above-described construction has the light emitting element 225 as a light source and has the optoelectronic transducer 238 as an image sensor element. The light emitting element 225 and the optoelectronic transducer 238 are both disposed over the same substrate 200. Thus, light emitted from the light emitting element 225 is reflected by a subject 237, and the reflected light launches into the optoelectronic transducer 238. Thus, a potential difference between both of the electrodes of the optoelectronic transducer 238 varies, and an amount of current corresponding to the varied potential difference flows between both of the electrodes. By detecting the amount of the flowing current, information on the subject 237 can be obtained. Then, the obtained information can be displayed by using the light emitting element 225. When image sensor function is used, it is preferable to use the mobile terminal being folded so as to light emitted from the light source can be reflected by a subject.

In other words, the light emitting element 225 plays two roles including a role as a light source to be used for reading information on a subject and a role of displaying images. The double-sided display panel 101 has two functions including an image sensor function for reading information on a subject and a display function for displaying images. The adoption of the double-sided display panel 101 according to this embodiment can significantly reduce the size, thickness and weight since a light source and light scatterer, which are generally required for use of the image sensor function, are not required separately irrespective of the provision of the two functions.

An example of an equivalent circuit of a double-sided display panel having the above-described construction will be described with reference to FIG. 4(B). FIG. 4(B) shows one pixel 250, and the pixel 250 has a sub-pixel 217 having the light emitting element 225 and a sub-pixel 249 having the optoelectronic transducer 238. The sub-pixel 217 has a signal line 220, a power supply line 221, a scan line 222, a switch transistor 223 for controlling input of video signals and a drive transistor 224 for feeding current in accordance with input video signals to the light emitting element 225. The construction of the sub-pixel 217 may be applied as a typical circuit construction in a section structure having the transistors and the light emitting element shown in FIG. 3(A).

The sub-pixel 217 has a capacitor element 227 for maintaining gate-source voltage of the drive transistor 224. However, when gate capacitance and parasite capacitance are enough for capacitance for maintaining gate-source voltage, the capacitor element 227 is not additionally required. The second electrode 204 of the light emitting element 225 is connected to an opposed power source 226.

On the other hand, the sub-pixel 249 has a signal line 240, a power supply line 241, scan lines 242 and 243, a reset transistor 246 for resetting a potential difference between both electrodes of the optoelectronic transducer 238, an amplitude transistor 245 for determining an amount of current flowing between the source and the drain in accordance with a potential difference between both of the electrodes of the optoelectronic transducer 238, and a switch transistor 244 for controlling input of signals read from the optoelectronic transducer 238 to a drive circuit. One of the P-type layer 231 and N-type layer 233 of the optoelectronic transducer 238 is connected to a power supply 248.

While an active-type light emitting element and an optoelectronic transducer are provided over one substrate here, a passive light emitting element and an optoelectronic transducer may be provided over one substrate as shown in FIG. 3(B). While described here is the case that the light emitting element 225 and the optoelectronic transducer 238 is provided over one pixel, every pixel does not have to include the optoelectronic transducer 238. The optoelectronic transducer 238 may be provided to every plurality of pixels in accordance with a subject to be scanned or an application of the mobile terminal. Since the aperture of the light emitting element 225 is increased therefor, brighter image can be provided.

This embodiment can be freely combined with the above-described embodiments.

Embodiment 4

An embodiment of the invention will be described with reference to drawings. A case that construction of a double-sided display panel 101 having first and second display screens according to this embodiment is different from those of the above-described embodiments will be described.

Figure 5:
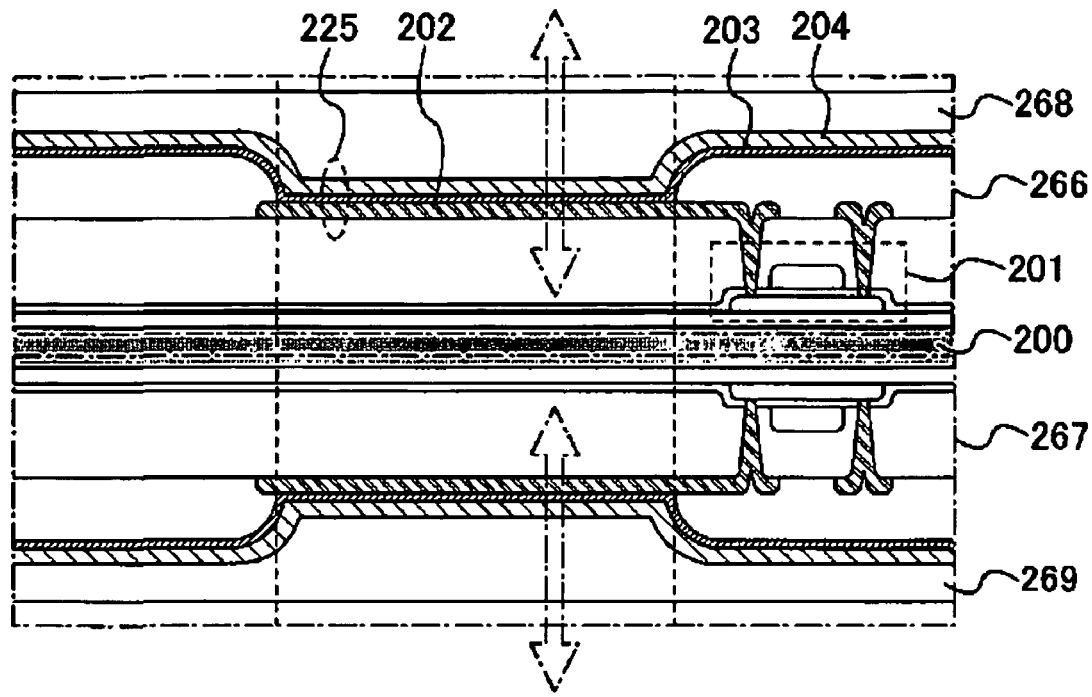
FIG. 5 is a section view of the double-sided display panel.
Figure 5:
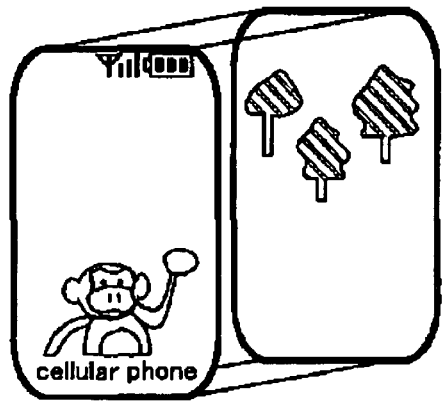
Figure 5:
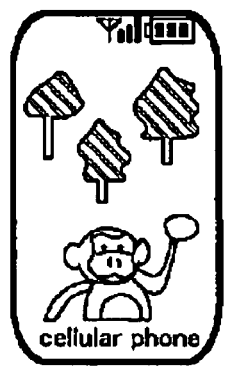

Since a section structure of parts 266 and 267 surrounded by the dotted lines in FIG. 5(A) is similar to the section structure shown in FIG. 3(A) except for insulating films 268 and 269 are formed, the detail description will be omitted here. An example of a method of producing a double-sided display panel shown in FIG. 5(A) will be briefly described below.

First of all, the transistor 201 and the light emitting element 225 are formed over a first substrate, which is a quarts or glass substrate, such that the same section structure as that of the parts 266 and 267 can be obtained. An insulating film is formed over the formed light emitting element 225, and an adhesive is formed on the insulating film. Then, a double-sided tape is sticked to the adhesive, and a second substrate is sticked to the double-sided tape. After that, the first substrate is peeled off by physical means to expose a primer film formed under the transistor 201. Next, an adhesive is formed on the exposed primer film, and is sticked to a third substrate by using the adhesive. Finally, once the second substrate is peeled off, the transistor 201 and the light emitting element 225 can be formed over the third substrate. In this case, the third substrate may be a substrate vulnerable to a temperature, such as a plastic substrate. Using a panel having a flexible plastic substrate fosters versatility. A plastic substrate is lightweight and is therefore especially effective for a mobile terminal. Semiconductor elements such as transistors are preferably sticked to the third substrate on the front and back on a back to back basis.

Using a mobile terminal having the above-described construction, images displayed on the panel 101 can be laid one over another. For example, as shown in FIG. 5(B), an animal image is displayed by using light emitting elements over one surface of the substrate 200 while a background image is displayed by using light emitting elements over the opposite surface of the one surface. Thus, perspective can be expressed, and images can be displayed three-dimensionally.

Alternatively, in order to display an image shot by a camera on a display screen, an image is displayed over one surface and a frame having a character, for example, may be placed over the opposite surface of the one surface. Or, an image including a person may be displayed over one surface, and a balloon including words may be placed over the opposite surface of the one surface. Furthermore, a received mail may be displayed over one surface, and warnings for incoming calls and/or new mails may be placed over the opposite surface of the one surface. Thus, display screens do not have to be switched upon receipt of incoming calls and/or new mails, and a large value can be added to the mobile terminal.

While active elements shown in FIG. 3(A) are pasted together here, passive elements shown in FIG. 3(B) may be pasted together.

This embodiment can be freely combined with the above-described embodiments.

Embodiment 5

An embodiment of the invention will be described with reference to drawings. According to this embodiment, a construction of a mobile terminal which has a plurality of stacked double-sided display panels each having first and second display screens will be described.

Figure 4:
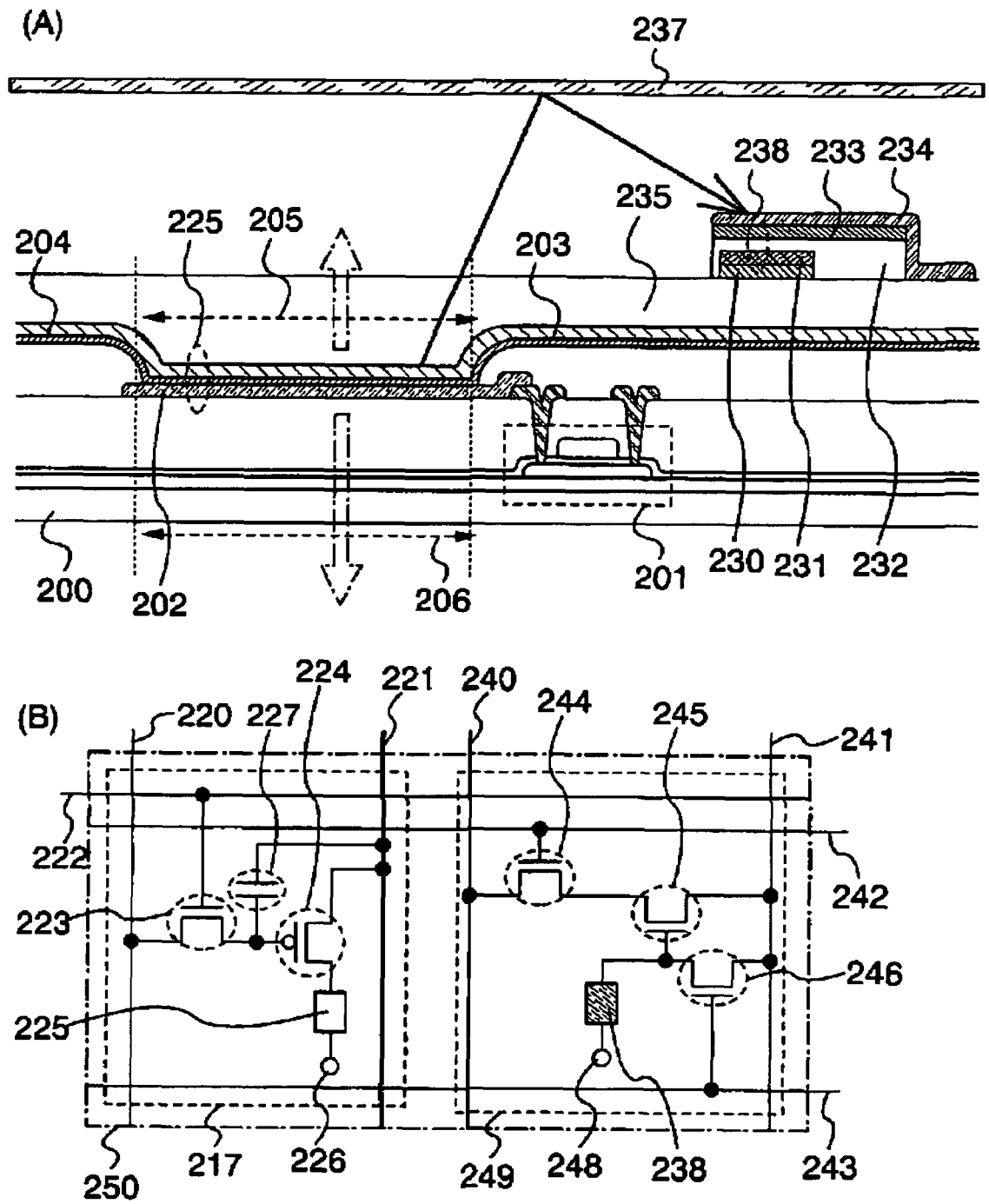
FIG. 4 includes a section view and a circuit diagram of a double-sided display panel including an image sensor function.
Figure 6:
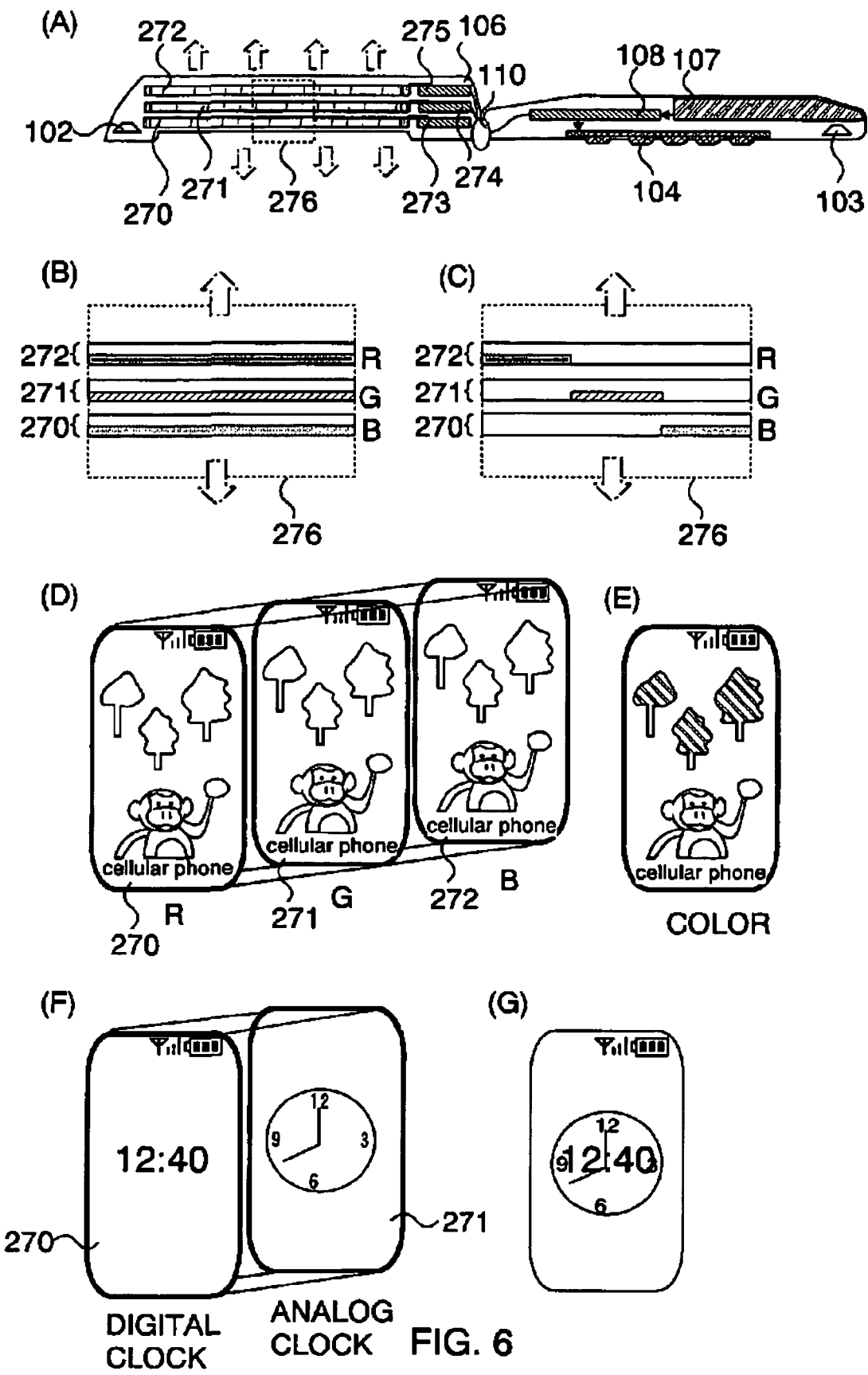
FIG. 6 is a diagram illustrating a foldable mobile terminal of the invention.

In FIG. 6(A), three double-sided display panels 270 to 272 are stacked, and modules 273 to 275 corresponding thereto for driving the panels 270 to 272 are stacked. Each of the three panels has any one of the constructions in FIGS. 3 to 5. However, since a panel having a construction having an image sensor element in FIG. 4 is preferably close to a subject as much as possible, the panel is preferably disposed at the closest position (the panel 270 or the panel 272) to a housing.

Then, images displayed on the three panels are stacked one over another so as to display a color image. For example, as shown in FIG. 6(D), blue (B), green (G) and red (R) images may be displayed on the panels 270, 271 and 272, respectively, and the images may be laid one over another. Thus, a color image shown in FIG. 6(E) can be displayed. In this case, in the panels 270 to 272, display elements for displaying RGB colors may be provided over the entire surfaces of the panels 270 to 272 as shown in FIG. 6(B), or display elements for displaying RGB colors may be arranged so as not to overlap each other as shown in FIG. 6(C). FIGS. 6(B) and 6(C) are enlarged views of an area 276 in FIG. 6(A).

Alternatively, with a mobile terminal having stacked two double-sided display panels, digital display may be implemented on one panel while analog display may be implemented on the other panel as shown in FIG. 6(F). Thus, the display which is overlapped with analog display and digital display can be implemented, which is greatly convenient. As described in Embodiment 4, an image may be displayed on one panel, and a frame and/or a balloon including words may be displayed on the other panel. Alternatively, a received mail may be displayed on one panel, and warnings for incoming calls and/or new mails may be displayed on the other panel.

Further another embodiment, a three-dimensional image (3D image) may be displayed on a plurality of (preferably two to seven) double-sided display panels laid one over another by changing the intensity of colors of images displayed on the respective double-sided display panels even when same images are displayed on the panels. This takes advantage of the point that a same object in an image can appear closer or farther in accordance with the intensity rate.

Thus, a mobile terminal having a construction including stacked plurality of panels can be significantly highly functioned and highly value-added.

The above-described construction having stacked plurality of double-sided display panels may be used not only in a mobile terminal but also as a display device and may be applied to other electronic equipment.

This embodiment can freely combine with the above-described embodiments.

Embodiment 6

Figure 10:
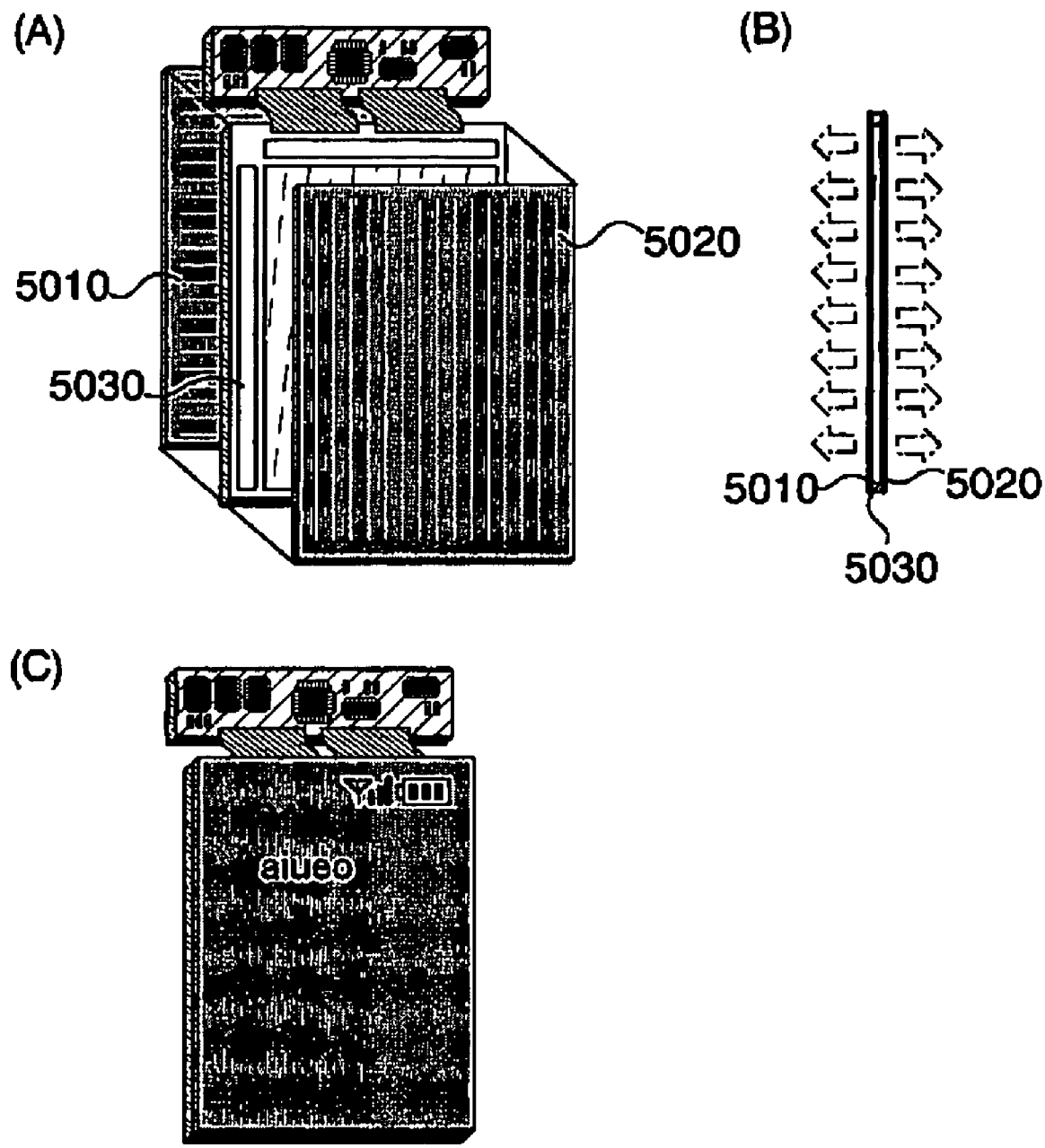
FIG. 10 is a diagram illustrating a double-sided display panel.

According to this embodiment, a double-sided display panel which is mounted in a mobile terminal of the invention and is different from the above-described embodiments will be described with reference to FIG. 10.

That is, in this embodiment, construction of a double-sided display panel 101 having first and second display screens according to this embodiment which is different from those of the above-described embodiments will be described.

In FIGS. 10(A) and 10(B), 5010 and 5020 are polarizers, and 5030 is a double-sided display panel. FIG. 10(A) is a front view. FIG. 10(B) is a side elevation view. According to this embodiment, the polarizers 5010 and 5020 are disposed on the front and back of the double-sided display panel 5030.

Since the panel having this construction has the polarizers 5010 and 5020 and is not transparent, a surrounding scene is not visible through the panel 5030.

This embodiment can be freely combined with the above-described embodiments.

Embodiment 7

The embodiment of this invention will be described with reference to drawings.

When both electrodes of a light emitting element, that is, the cathode and anode, contain a material having a translucency and a substrate having a translucency or sealing substrate is used, light emitted from a layer including an organic compound can be passed both through the cathode and the anode to implement simultaneous two-way display.

The light emitting element has a construction in which an organic-compound-contained layer is provided between a pair of electrodes. One of the pair of electrodes is an anode while the other is a cathode.

However, because of an interference effect due to a difference in optical distance, light emitted from the upper surface and light emitted from the lower surface differ in optical characteristic (such as tone). When a full-color double-sided display panel is produced by using red, green and blue light emitting elements (EL elements) including anodes and cathodes of a material having a translucency, there is a problem that light emitted from the upper surface and light emitted from the lower surface may differ in color coordinates. When the color coordinates differ, same gray-scale display cannot be achieved between the upper surface and the lower surface.

Since optical distance depends on a wavelength, the thicknesses of an organic-compound-contained layer, an anode, a cathode, a protective film and so on must be controlled for each of RGB for full-color display.

Then, in this embodiment, a light emitting element (EL element) having a cathode and anode containing a material having a translucency has a construction, which can achieve a uniform tone in both light emission to the upper surface and light emission to the lower surface, and high quality image display. The light emitting element will be described below.

Figure 11:
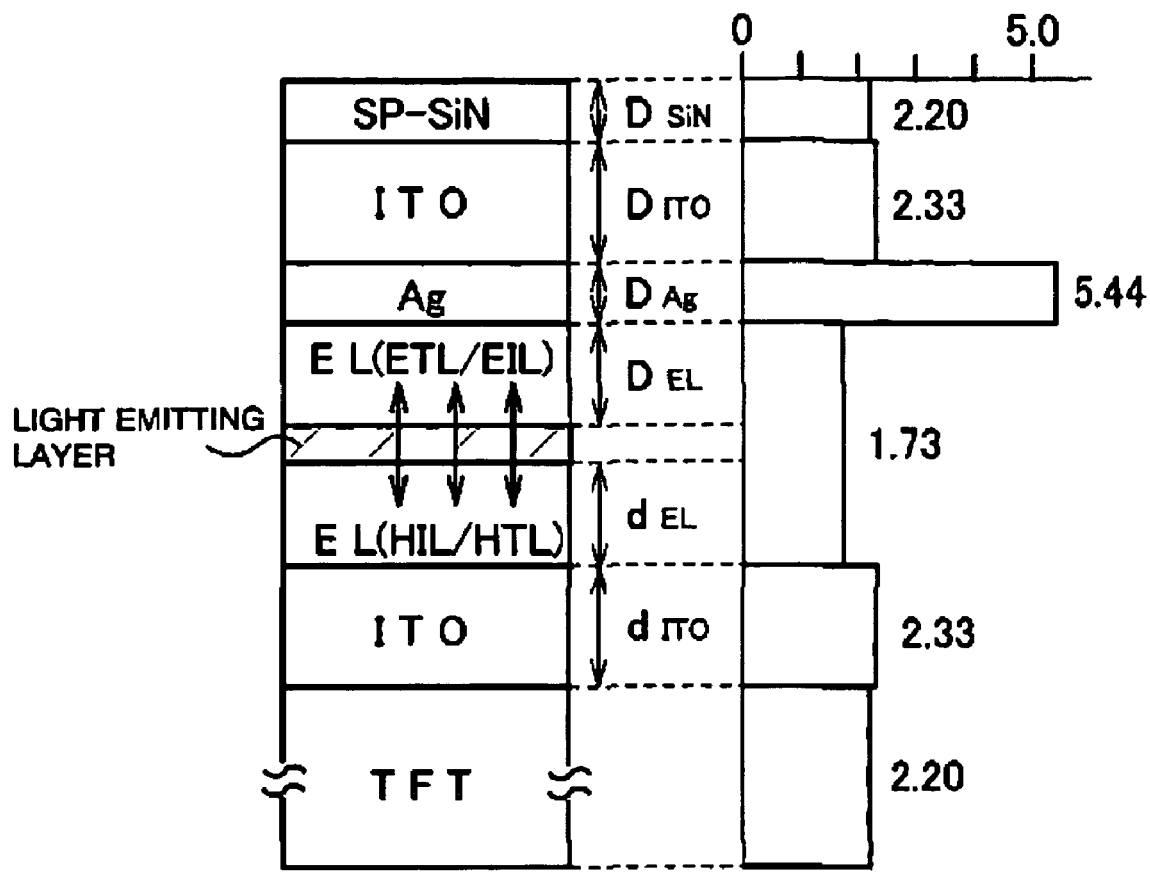
FIG. 11 is a model diagram of a laminate of an EL element.

First of all, a simulation is performed by using a laminate model shown in FIG. 11.

A same tone is achieved between light emitted from the upper surface and light emitted from the lower surface by adjusting thicknesses of layers common to the three kinds (R, G and B) of EL elements, that is, the thickness of a metal thin film functioning as a cathode and the thickness of a transparent conductive film thereon.

As shown in FIG. 11, an EL element has a laminate of an anode of ITO, a layer including plurality of organic compounds which includes a light-emitting layer (EL layer), a cathode including a metal thin film (Ag, silver), a transparent electrode of ITO, a protective film of SiN (silicon nitride) in that order. The EL layer in the EL element has a part on the cathode side and a part on the anode side across a light-emission interface of the light emitting layer. A refractive index of a material depends on a wavelength, and FIG. 11 shows maximum values of refractive indexes.

In FIG. 11, d is a thicknesses of thin films on the anode side and D is a thicknesses of thin films on the cathode side.

Light from the light-emission interface of the light-emitting layer to the anode contributes to externally emitted light through the anode, the TFT-included layer and the transparent substrate. Light from the light-emission interface of the light-emitting layer to the cathode contributes to the externally emitted light through the metal thin film, the transparent electrode, the protective film, a spacing and the transparent substrate.

A difference in refractive index between the Ag-contained metal thin film and the EL layer and a difference in refractive index between the Ag-contained metal thin film and the transparent electrode are significantly larger than a difference in refractive index between other layers adjacent to each other. According to this embodiment, light emitted from the cathode side and light emitted from the anode side are conformed by adjusting the thicknesses of the metal thin film and transparent electrode.

In other words, the transmittance, reflectivity and absorption coefficient of light emitted from the cathode side and the transmittance, reflectivity and absorption coefficient of light emitted from the anode side are conformed by adjusting the thicknesses of the metal thin film and transparent electrode.

Here, it is assumed that a red light emitting element having a peak at 620 nm, a green light emitting element having a peak at 530 nm and a blue light emitting element having a peak at 450 nm are used in order to implement full-color display. In reality, light emitted from the EL element has a wider peak rather than a rapid peak.

With the three wavelengths (620 nm, 530 nm and 450 nm), light emitted from the upper surface, and the transmittances, reflectivities and absorption coefficients of light emitted from the lower surface can be obtained by simulation. In the case using Ag as a metal thin film, that is to be the cathode, with 6 nm to 10 nm, typically, 8 nm and using the transparent conductive layer (ITO) thereabove of 240 nm to 290 nm and 380 nm to 500 nm, typically, 260 nm. Thereby light emitted from the upper surface, and the transmittances, reflectivities and absorption coefficients of light emitted from the lower surface is substantially conformed between R, G and B.

In this way, by this embodiment, a uniform tone in both light emission to the upper surface and light emission to the lower surface, and high quality image display can be achieved.

The EL layer has a laminate of an HIL (hole-injection layer), an HTL (hole transporting layer), an EML (light emitting layer), an ETL (electron transporting layer) and an EIL (electron-injection layer) in that order from the anode side. More specifically, CuPc, is used as the HIL, α-NPD is used as the HTL, BCP is used as the ETL and BCP: Li is used as the EIL, respectively. For the EML, Alq$_3$ containing dopants may be used corresponding to emitted light colors, R, G and B.

When the thickness of Ag is 5 nm or below, the electrical resistance ratio becomes high. Furthermore, Ag is a material having high Ohmic contact. Ag also has an effect of protecting the EL layer from a damage due to sputtering of ITO, which will be formed later. Still further, when the thickness of Ag is 11 nm or more, the transmittance of light becomes undesirably low and this is not preferable. Ag is a material having good adhesiveness and easily producing stable film quality even formed into a thin film, by adjusting a deposition rate. In addition, when the transparent conductive layer (ITO) is less than 240 nm, a difference occurs in transmittance, reflectivity and absorption coefficient between light emitted from the upper surface and light emitted from the lower surface. The transparent conductive layer (ITO) is preferably thinner than 500 nm in consideration of the deposition time.

Figure 13:
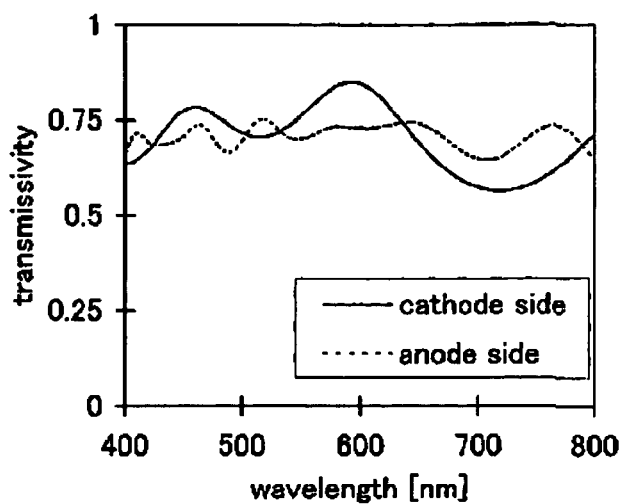
FIG. 13 is a diagram showing transmittances, absorption coefficients and reflectivities.
Figure 13:
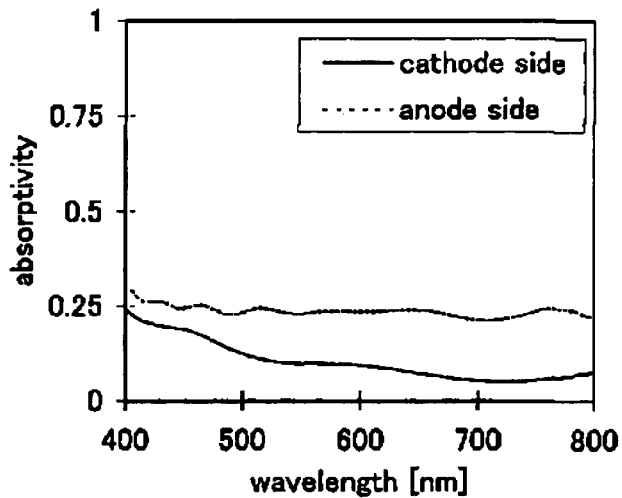
Figure 13:
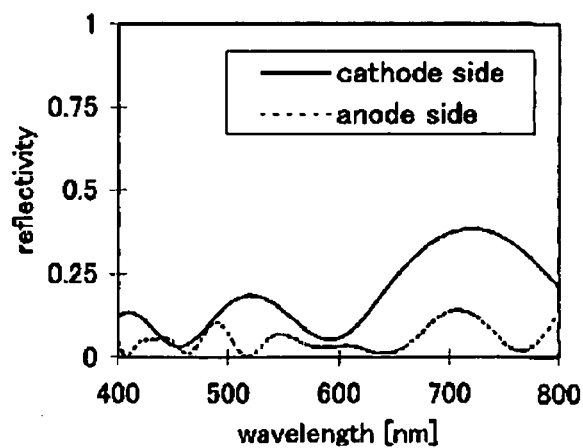

The transmittances, reflectivities and absorption coefficients of light emitted from the upper surface and light emitted from the lower surface can be substantially conformed for R, G and B when the thickness of Ag is 8 nm and the thickness of the transparent conductive layer is 260 nm. The thicknesses of the layers are shown in FIG. 12. Here, it is assumed, as shown in FIG. 12, that light emitted from the anode side sequentially passes through the EL layer (HTL/HIL) of 33 nm, ITO of 110 nm, the silicon nitride film (SP—SiN) of 100 nm, acrylic resin of 1000 nm, a silicon oxide nitride film (SiON) of 100 nm, a silicon oxide film (SiO$_2$, described as GI in the figure) of 110 nm, a silicon oxide nitride film (SiON) of 100 nm, a silicon nitride oxide (SiNO) of 50 nm and a glass substrate. It is assumed that light emitted from the cathode side sequentially passes through an EL layer (ETL/EIL) of 90 nm, Ag of 8 nm, ITO of 260 nm, a silicon nitride film (SP—SiN) of 100 nm, the air and a glass substrate. It is further assumed that the air between the glass substrate and the silicon nitride film is 0 nm thick, that is, has no thickness. The transmittances, reflectivities and absorption coefficients at set values in FIG. 12 are shown in FIG. 13.

The reflectivities and transmittances shown in FIG. 13 can be calculated by simulating a multi-layer film in accordance with the steps below.

Figure 14:
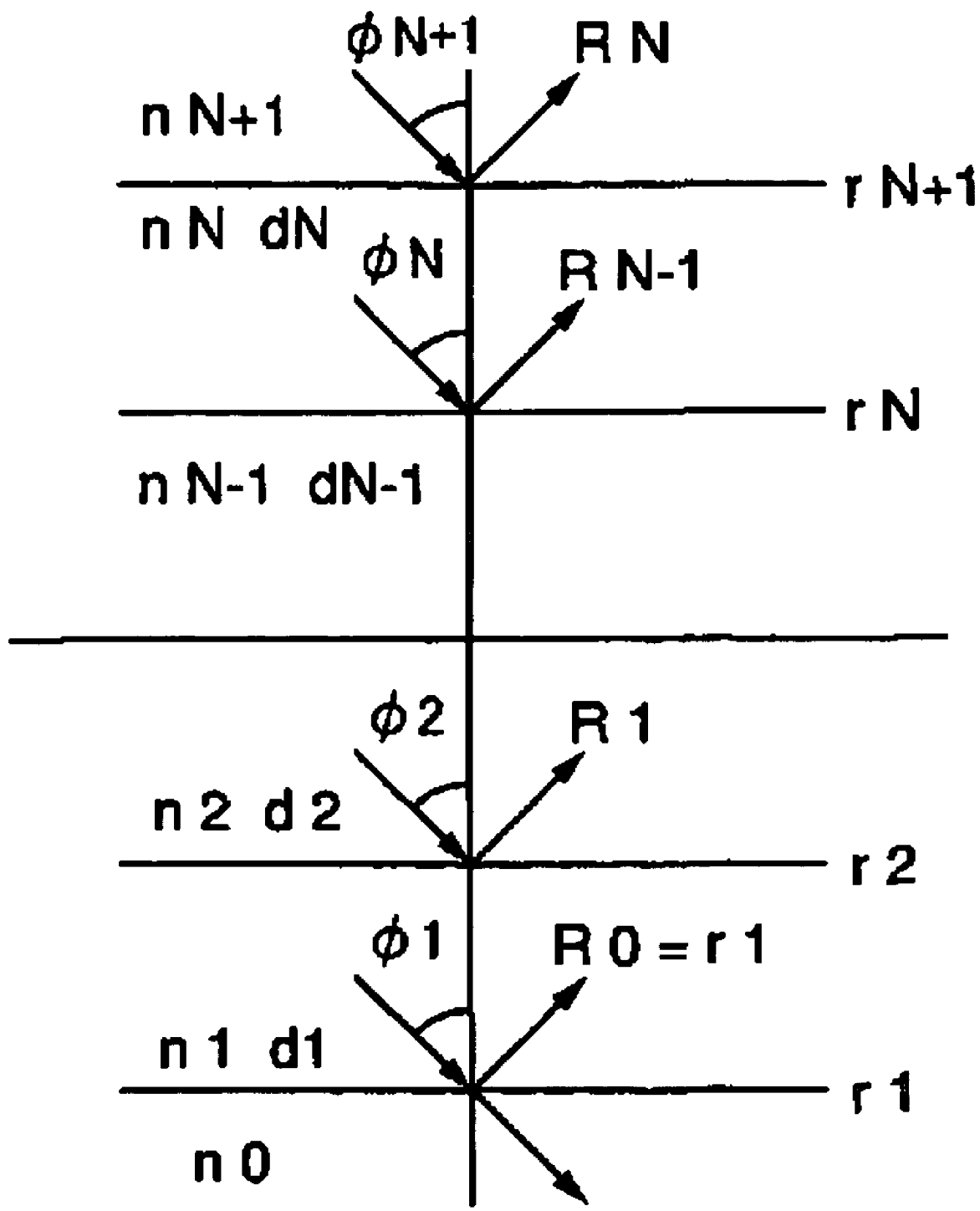
FIG. 14 is a model diagram of a multi-layer film.

In an N-multi-layer film, for example, as shown in FIG. 14, a reflectivity $R_1$ from the first layer can be expressed by equation $$R_1=(r_2+r_1\exp(-2i\delta_1))/(1+r_2 r_1\exp(-2i\delta_1)). \quad (1)$$

In FIG. 14, n is a refractive index, d is a thickness, r is a Fresnel reflective coefficient, $\phi$ is an incident angle and R is an amplitude reflectivity (called reflectivity, hereinafter). Therefore, $n_j$ is a refractive index of the interface between a $(j-1)^{th}$ layer and a $j^{th}$ layer, $d_j$ is a thickness of the $j^{th}$ layer, $r_j$ is a Fresnel reflective coefficient of the $j^{th}$ layer, $\phi_j$ is an incident angle of light launching from the $(j-1)^{th}$ layer to the $j^{th}$ layer and $R_j$ is a reflectivity from the $j^{th}$ layer. In equation (1), i represents an imaginary unit ($i^2=-1$) and $\delta$ represents a phase difference. For example, $\delta_1$ represents a phase difference when light travels to the first layer and back.

When the first layer is regarded as a boundary having the reflectivity represented by $R_1$, the reflectivity $R_2$ from the second layer can be expressed by equation $$R_2=(r_3+R_1\exp(-2i\delta_2))/(1+r_3 R_1\exp(-2i\delta_2)) \quad (2)$$

By sequentially following the above-described steps to the uppermost layer, the reflectivity of the multi-layer film can be obtained. In an actual simulation, a program is created by using the following recurrence relation as a sub-routine.

A reflectivity $R_j$ from a $j^{th}$ layer can be expressed by equation $$R_j=(r_{j+1}+R_{j-1}\exp(-2i\delta_j))/(1+r_{j+1}R_{j-1}\exp(-2i\delta_j)), \quad (3)$$

which is generalized from equation (1) and equation (2). The equation (3) holds when $R_0=r_1$ and $\delta_j=(2\pi/\lambda)n_j d_j \cos\phi_j$.

However, since only the case of vertical incidence is assumed in the simulation according to this embodiment, $\cos\phi_j=1$. A transmittance can be calculated similarly. A recurrence relation of an amplitude transmittance (called transmittance hereinafter) $T_j$ of a $j^{th}$ layer can be expressed by equation $$T_j=T_{j+1}t_{j-1}\exp(-i\delta_j)/(1+r_{j+1}R_{j-1}\exp(-2i\delta_j)). \quad (4)$$

The equation (4) holds when $T_N=t_N$ and $\delta_j=(2\pi/\lambda)n_j d_j \cos\phi_j$.

In equation (4), t is a Fresnel transmittance coefficient. That is, $t_j$ is a Fresnel transmittance coefficient of the $j^{th}$ layer.

Also for a transmittance, $\cos\phi_j=1$.

By following the above-described steps, reflectivities and transmittances of a multi-layer film can be calculated. An absorption coefficient can be calculated by 1−(reflectivity+transmittance).

As described above, when a red light emitting element having a peak at 620 nm, a green light emitting element having a peak at 530 nm and a blue light emitting element having a peak at 450 nm are used, for example, one or more factors selected from transmittances, reflectivities and absorption coefficients can be conformed or be substantially conformed between the cathode side and the anode side by adjusting the thickness of a laminate constituting each of the light emitting elements. Then, calculations of chromaticity coordinates of red, green and blue by using the values of the one or more factors selected from the transmittances, reflectivities and absorption coefficients, result in a chromaticity diagram including same or substantially same triangles with three chromaticity coordinates of blue, green and blue between the cathode side and the anode side. Thus, image display having a uniform tone between light emitted to the upper surface and light emitted to the lower surface, and having high quality can be obtained.

In other words, a light emitting element, which is a component of the invention, has a first electrode having a translucency, a layer containing organic compounds emitting red, green and blue light in contact with the first electrode, and a second electrode having a translucency in contact with the layer containing the organic compound. It is characterized that one or more factors selected from transmittances, absorption coefficients and reflectivities of light through the first electrode and the light through the second electrode are the same or substantially the same.

While Ag is used as an example of the metal thin film, here, a material having a low work function, such as Al, Li and Ca, alloys thereof such as MgAg, MgIn, AlLi and $CaF_2$, or CaN may be used. While ITO (alloy of indium oxide and tine oxide) is used, for example, as the transparent electrode here, $In_2O_3$—ZnO (alloy of indium oxide and zinc oxide), ZnO (zinc oxide), ITSO (alloy of indium oxide and tin oxide containing Si) or the like may be used instead. When one of these materials is used, the thickness may be determined in consideration of the refractive index of the material.

The invention is not limited to a light emitting apparatus for implementing full-color display by using three kinds (R, G and B) of EL elements but can be applied to a double-sided display panel for implementing full-color display by combining a white light-emitting EL element and a color filter or to a double-sided display panel for implementing full-color display by combining a blue light emitting EL element and a color-converting layer.

In other words, a light emitting element, which is a component of the invention, has a first electrode having a translucency, a layer containing an organic compound emitting a white light in contact with the first electrode, and a second electrode having a translucency in contact with the layer containing the organic compound. The light emitting element further has a first color filter on the first electrode and a second color filter on the second electrode. One or more factors selected from transmittances, absorption coefficients and reflectivities of light through the first electrode and the first color filter and the light through the second electrode and the second color filter are the same or substantially the same.

This embodiment can be freely combined with the above-described embodiments.

Embodiment 8

Figure 16:
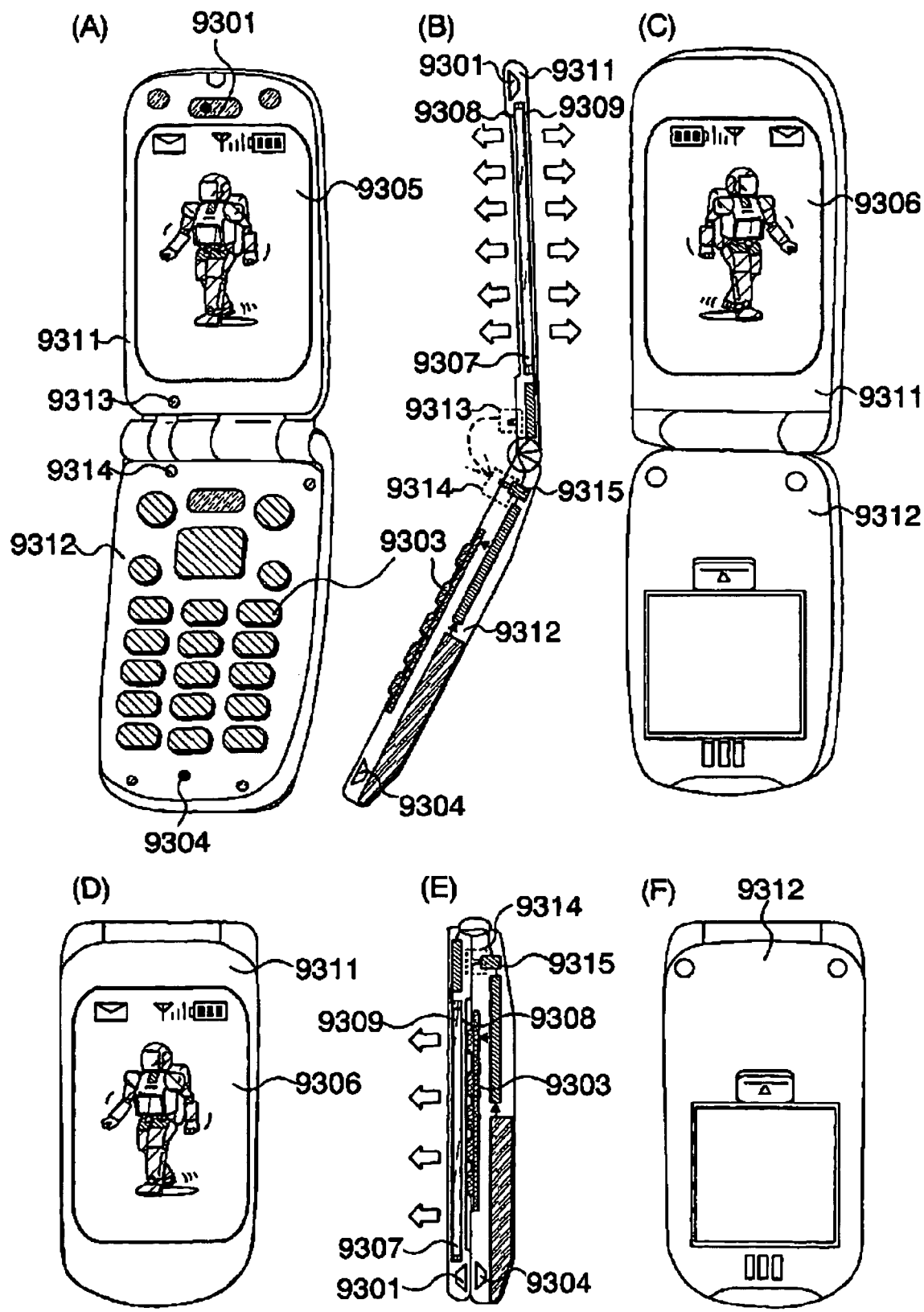
FIG. 16 is a diagram illustrating a foldable mobile terminal of the invention.

This embodiment will be described with reference to FIGS. 16(A) to 16(F). FIG. 16(A) is an internal view of this embodiment in an open state. FIG. 16(B) is a section view of this embodiment in the open state. FIG. 16(C) is an external view of this embodiment in the open state. FIG. 16(D) shows a first housing 9311 of this embodiment in a closed state. FIG. 16E is a section view of this embodiment in the closed state. FIG. 16(F) is a view of a second housing 9312 side. A foldable mobile terminal of the invention has the first housing 9311 having a receiver 9301 and a double-sided display panel 9307 and a second housing 9312 having a transmitter 9304 and operation buttons 9303, and are connected foldably through a hinge (refer to FIG. 16(B)).

A first display screen 9305 and a second display screen 9306 are provided on the front and back of the double-sided display panel 9307. Polarizers 9308 and 9309 are pasted onto the front and back of the double-sided display panel 9307.

External light can be shielded by disposing these two polarizers 9308 and 9309 such that the polarizing directions thereof cross each other. The crossing angle may be from 40° to 90°, preferably 70° to 90°, and more preferably 90°. Under this construction, black display is implemented except display area. Thus, the background is not visible through from any sides.

In other words, the arrangement of the polarizers 9308 and 9309 allows the light emitted from light emitting elements while preventing external light from passing through the double-sided display panel 9307, which improves the contrast.

The polarizers 9308 and 9309 can change the transmittance of the double-sided display panel 9307 by adding the means for arranging one or both of which rotatable and be provided, and by changing the crossing angle. In other words, a dimming function can be added. An antireflective film may be provided outside of the polarizers 9308 and 9309 to decrease reflectivity and improve the display quality. In addition, a ½ wave plate (or film) or ¼ wave plate (or film) may be added. The addition of an optically functional film can improve display quality, and contrast with black, especially, can be improved.

A ½ wave plate (which may be called $\lambda/2$ plate or phase difference plate) has a function for giving a phase difference $\pi$ (180°) between a crystallographic axis and an axis orthogonal thereto. A ¼ wave plate (which may be called $\lambda/4$ plate or phase difference plate) has a function for giving a phase difference $\pi/2$ (90°) between a crystallographic axis and an axis orthogonal thereto. In other words, when straight-line polarization is launched into a crystallographic axis with the direction of 45°, circular polarization is caused. Conversely, when circular polarization launches, a straight-line polarization with the direction of 45° is caused. Accordingly, one or both of the ½ wave plate and the ¼ wave plate are pasted over the surface of the double-sided display panel 9307. The polarizers 9308 and 9309 are pasted over the surface of one or both of the ½ wave plate and the ¼ wave plate. Since external light reflected by the panel has a polarizer axis different from a polarizer axis of the polarizer by 90° because of the arrangement of the wave plate or wave plates, the external light does not pass through the polarizer. In other words, unnecessary light internally reflected by the double-sided display panel 9307 can be reduced, and clearer black display and higher contrast can be achieved.

A foldable mobile terminal of the invention has an opening/closing detecting means. The opening/closing detecting means includes a projection 9313 provided in the first housing 9311 and a hole 9314 and a control means 9315 provided in the second housing 9312. When the first housing 9311 and the second housing 9312 are in a closed state, the projection 9313 is in contact with the control means 9315 which is disposed under the hole 9314. Thus, normal display is set to be performed on the first display screen 9305. On the other hand, when the first housing 9311 and the second housing 9312 are in the open state, no projection is in contact with the control means 9315. Thus, normal display is set to be performed on the second display screen 9306. The opening/closing detecting means is not limited to the above-described construction, and a user may perform the function by using a general button.

The double-sided display panel 101 having the wave plate or wave plates and polarizers may be used as a display device or may be applied to not only a mobile terminal but also other electronic equipment.

EXAMPLES

Example 1

Components of a foldable mobile terminal of the invention and the relations among them will be described in this example with reference to a block diagram shown in FIG. 7.

First of all, a mobile telephone, among mobile terminals is taken as an example, which includes, as basic components, a double-sided display panel 101, a speaker 102 functioning as a receiver, a microphone 103 functioning as a transmitter and operation buttons 104 to be manipulated by a user.

As shown in FIG. 4, the double-sided display panel 101 may have an image sensor 306 which is controlled by a controller 301 and a sensor controller 302. The operation buttons 104 are controlled by a button controller 303. These controllers are centrally managed by a CPU 300. The CPU 300 is connected to a storage medium such as a flash memory 310, a DRAM 311 and a VRAM 312, an external interface 309, an opening/closing detecting sensor 308, an infrared ray communication 307 and so on.

The double-sided display panel 101 is connected to a switch circuit 321. The switch circuit 321 plays a role of controlling the display on two display screens included in the double-sided display panel 101 and, more specifically, plays a role of controlling which display screen of the two display screens included in the double-sided display panel 101 is to be used for normal display.

In response to a manipulation on the operation buttons 104 by a user, information is displayed on the double-sided display panel 101 through the button controller 303, the CPU 300 and the controller 301. The similar path is followed in response to a manipulation on the image sensor 306 by a user, and information is displayed on the double-sided display panel 101 through the sensor controller 302, the CPU 300 and the controller 301.

The speaker 102 which is used by a user to listen to what the other party talks has the following circuits until the voice of the other party reach ears of the user. First of all, a transmitting/receiving circuit 320 receives information regarding what the other party talks and then supplies the information to a data processing circuit 313 through the CPU 300. The information is converted to analog signals in a D/A converter circuit 315, and the resulting analog signals are amplified in an amplifier 317 and are finally supplied to the speaker 102. In order to supply user's voice to a mobile terminal of the other party through the microphone 103, the reversed path can be used. In other words, information regarding user's voice is transmitted from the microphone 103 to the data processing circuit 313 through the amplifier 316 and an A/D converter circuit 314, is finally supplied to the transmitting/receiving circuit 320 and is given to the mobile terminal of the other party.

A camera 305 having a shooting function is controlled by a camera controller 304, and the camera controller is managed by the CPU 300. An image shot by the camera 305 is stored in a storage medium such as the flash memory 310 and is displayed on the double-sided display panel 101 through the CPU 300 in accordance with a manipulation on the operation buttons 104 by a user.

Figure 7:
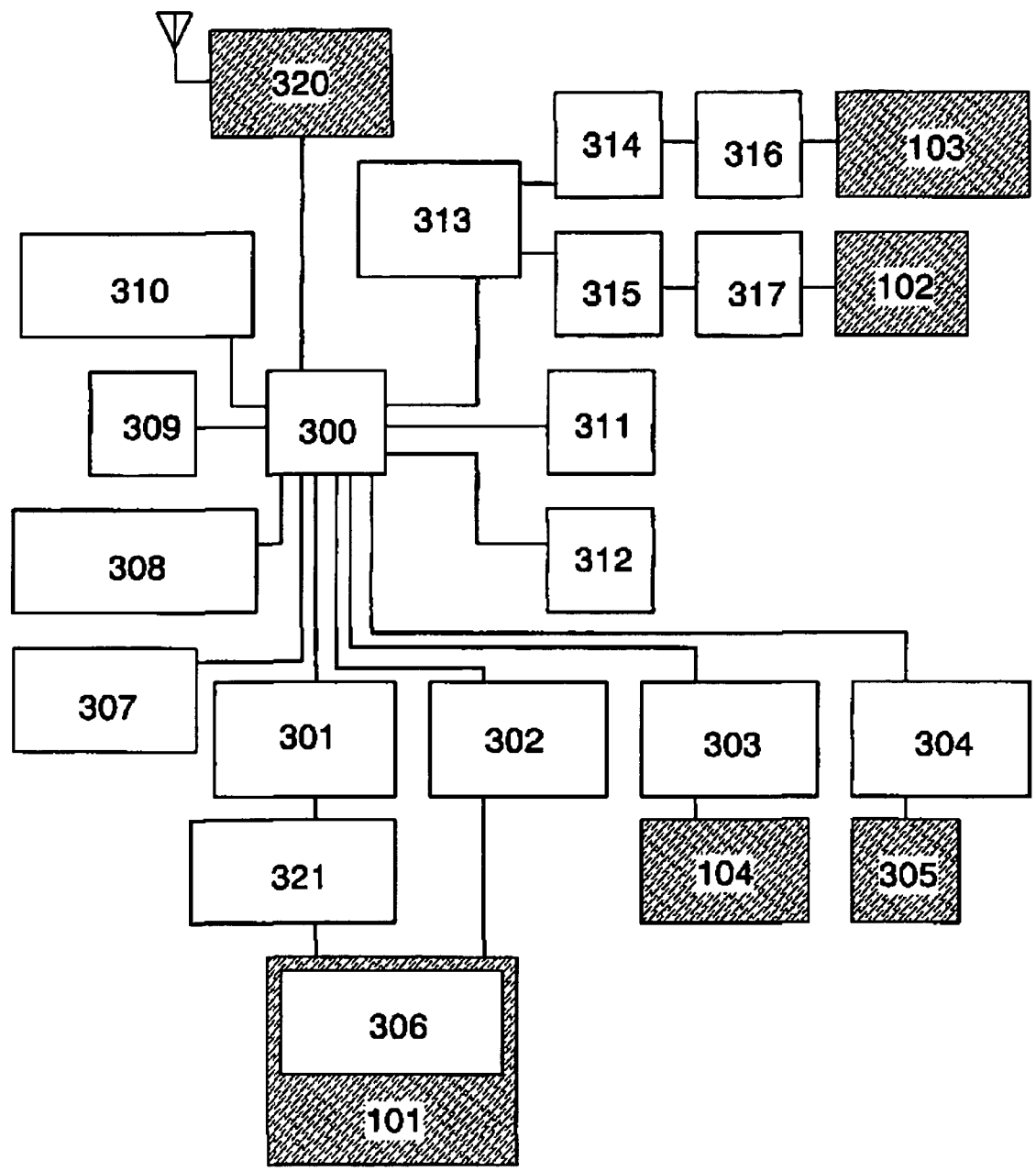
FIG. 7 is a block diagram illustrating a configuration of the foldable mobile terminal of the invention.

While some of the components of the mobile terminal are shown in FIG. 7, the invention is not limited thereto. The mobile terminal may include other components.

This example can be freely combined with the above-described embodiments.

Example 2

A switch circuit which is one component of a mobile terminal of the invention, will be described in this example with reference to drawings.

Figure 9:
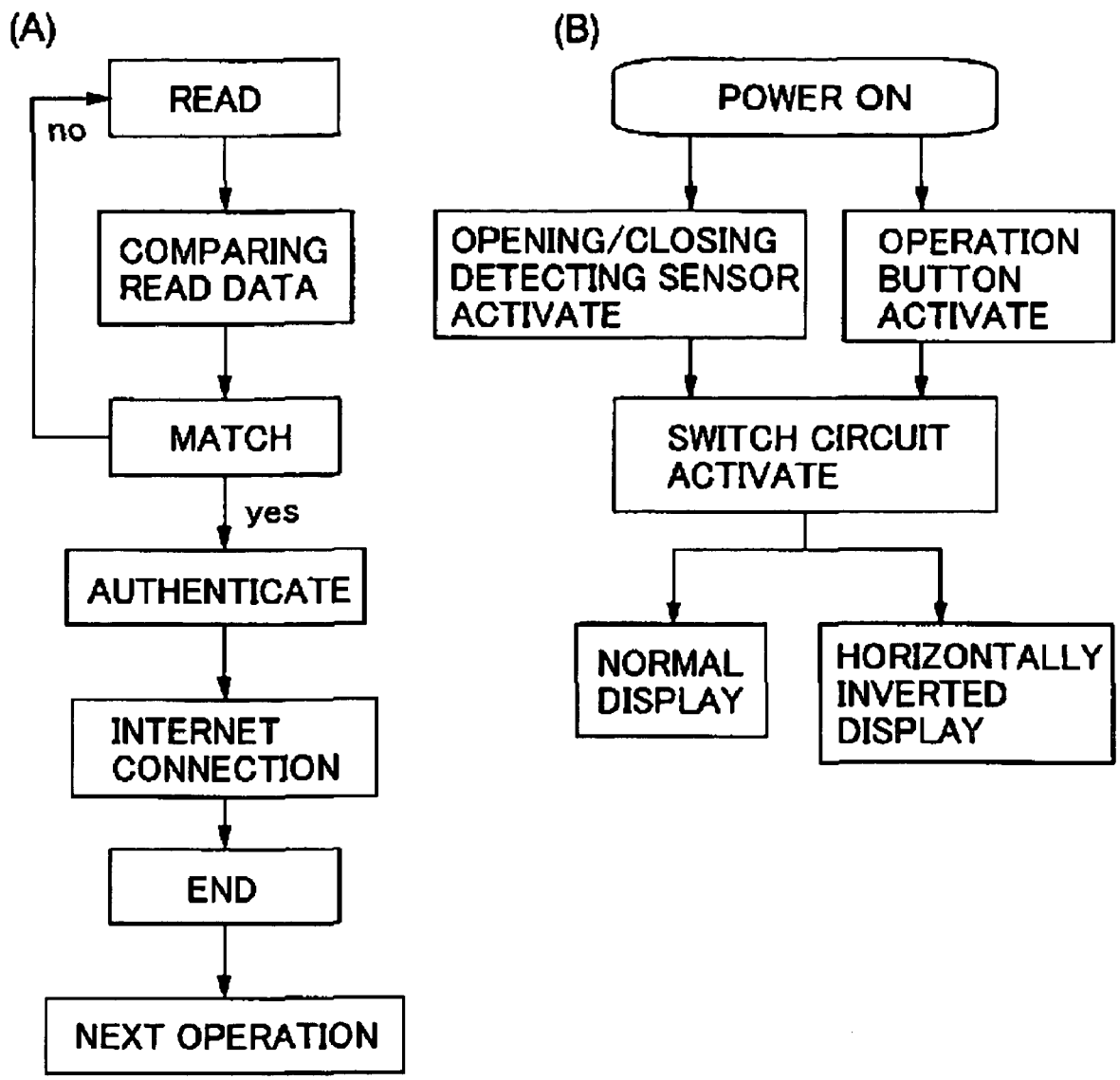
FIG. 9 is a flowchart describing a personal authentication system.

A mobile terminal of the invention includes a double-sided display panel 101, and not a normal display, but a horizontally-inverted display can be easily viewed depending on viewing direction. Thus, as illustrated in a flowchart in FIG. 9(B), after power is turned on, an opening/closing detecting sensor 308 which identifies an opening state and closing state of two housings of the foldable mobile terminal, and operation buttons 104 are firstly activated. Then, a switch circuit 321 is also activated. Signals are supplied from the opening/closing detecting sensor 308 or the operation buttons 104 to the panel 101. Thus, preferably, images to be displayed on the double-sided display panel 101 can be easily horizontally inverted.

Under this construction, the display can be easily switched, and a user can view normal display. The display may be switched by using either the opening/closing detecting sensor 308 or operation buttons 104. When the opening/closing detecting sensor 308 is used, the display may be automatically switched such that normal display can be performed on the internal display screen when the housings are open and normal display can be performed on the external display screen when the housings are closed.

Now, an example of a method of horizontally inverting an image to be displayed on the double-sided display panel 101 will be described. In this example, the double-sided display panel 101 has a signal line drive circuit 401, a scan line drive circuit 402 and a pixel portion 403, for example.

Figure 8:
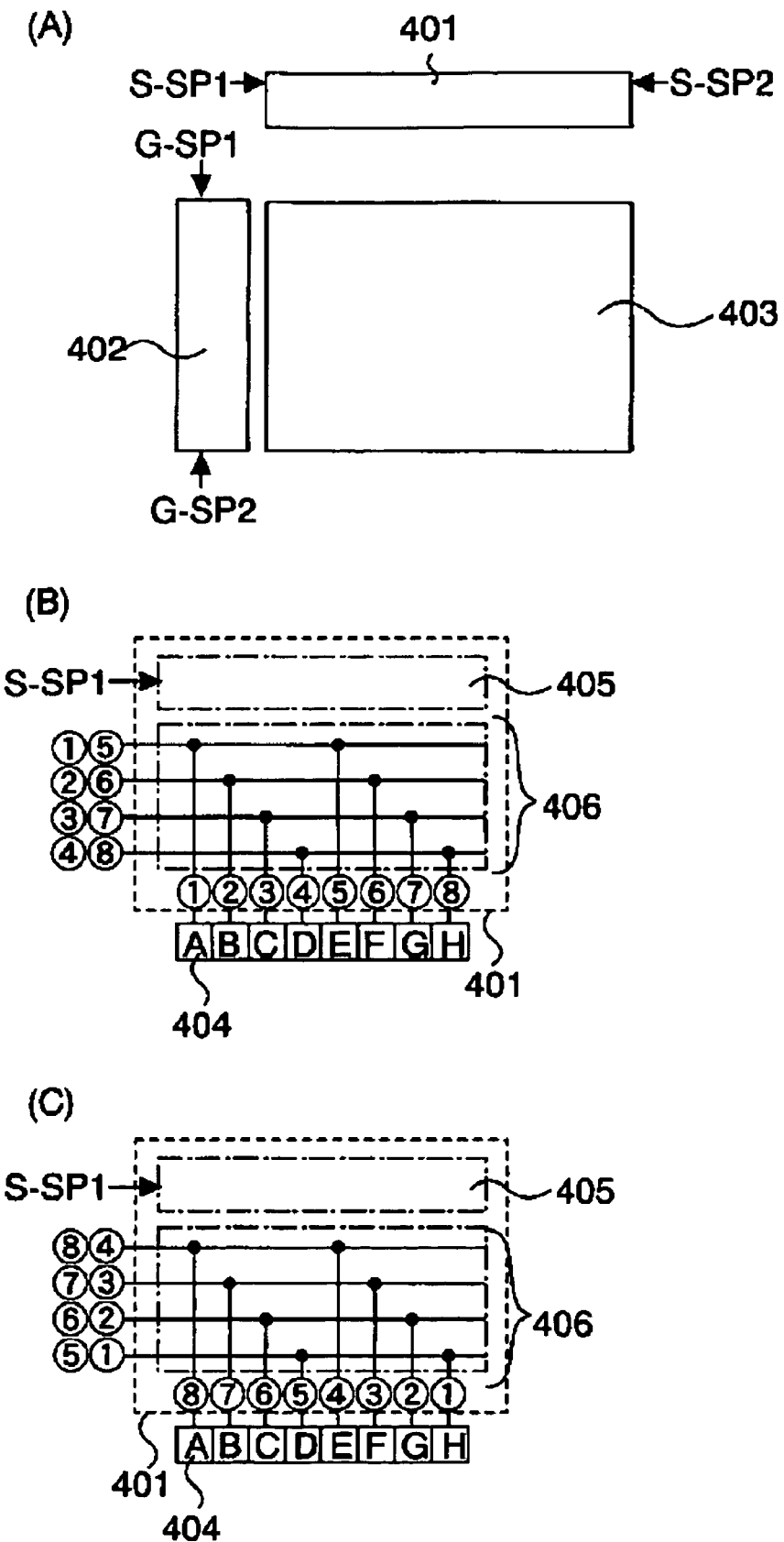
FIG. 8 is a block diagram illustrating a switch circuit.

As shown in FIG. 8(A), the switch circuit 321 controls the signal line drive circuit 401 and scans line drive circuit 402 that the double-sided display panel 101 has. When sectional-drive is not performed, points for supplying start pulses are switched by the switch circuit 321. More specifically, in case of performing normal display, start pulses (S-SP1 and G-SP2) are supplied such that a first column at a first row can operate first. On the other hand, in case of performing horizontally-inverted display, start pulses (S-SP2 and G-SP2) are supplied such that the last column and the last row can operate first. Thus, an image to be displayed on the double-sided display panel 101 can be horizontally inverted with ease.

When sectional-drive is performed, the operation of the scan line drive circuit 402 is the same as the normal operation, and the operation of the signal line drive circuit 401 can be devised. In this example, a case in which four video lines 406 are provided, and eight pixels 404 are provided is taken as an example.

As shown in FIG. 8(B), in case of performing normal display, video signals (1) to (8) are sequentially supplied to eight pixels A to H, respectively. This is the same for scanning for a normal panel. On the other hand, as shown in FIG. 8(C), in case of performing horizontally-inverted display, video signals (8) to (1) are sequentially supplied to eight pixels A to H, respectively. In other words, in order to perform a horizontally inverting operation, video signals to be supplied to the video lines 406 are changed. For example, the video signals (1) and (5) are supplied to a first video line for normal display while the video signals (8) and (4) are supplied to a first video line for horizontally-inverted display. Thus, an image to be displayed on the double-sided display panel 101 can be horizontally inverted with ease.

When time tone display is applied to the double-sided display panel 101, video signals are read into a memory and then converted to signals for time-tone display. Therefore, in this case, in reading video signals to a memory, the order of reading the video signals is preferably changed as required for normal display or horizontally-inverted display.

This example can be freely combined with the above-described embodiments and example.

Example 3

A system to be used in the mobile terminal will be described in this example with reference to drawings.

According to this embodiment, when the double-sided display panel 101 having the construction described with reference to FIG. 4 is used, a mobile terminal having two functions of a display function and a reading function can be provided. Here, a personal authentication system taking advantage of the reading function will be described in this example with reference to FIG. 7 and a flowchart in FIG. 9(A).

First of all, biological information of a person is read by using an image sensor 306 in the double-sided display panel 101. Here, the term, "biological information", refers to information indicating a physical feature that a human being inherently has and information which can be used for identifying a human individual. Typical biological information may be a fingerprint, a palm print or the like. In consideration of sizes of the housings of the mobile terminal and a size of the double-sided display panel 101, a fingerprint, especially, a fingerprint of the thumb is preferably read as biological information. However, the invention is not limited thereto, and a palm print or a voice print acquired through the microphone 103 may be used as biological information.

The acquired biological information is compared with and checked against biological information prestored in a storage medium within the mobile terminal through the CPU 300. Here, if the two pieces of information match, the user is authenticated as a valid owner of the mobile terminal and can perform processing (that is, Internet connection processing here) continuously. Once the processing ends, the user can go to the next operation. If the acquired biological information does not match, the reading operation is performed again.

The personal authentication system in this example is preferably performed before all processing which may cause a trouble when performed by other people, such as communication process on a billing basis and processing of rewriting a storage medium in the mobile terminal. Thus, invalid processing by using the mobile terminal can be prevented.

This example can be freely combined with the above-described embodiments and examples.

Example 4

Figure 15:
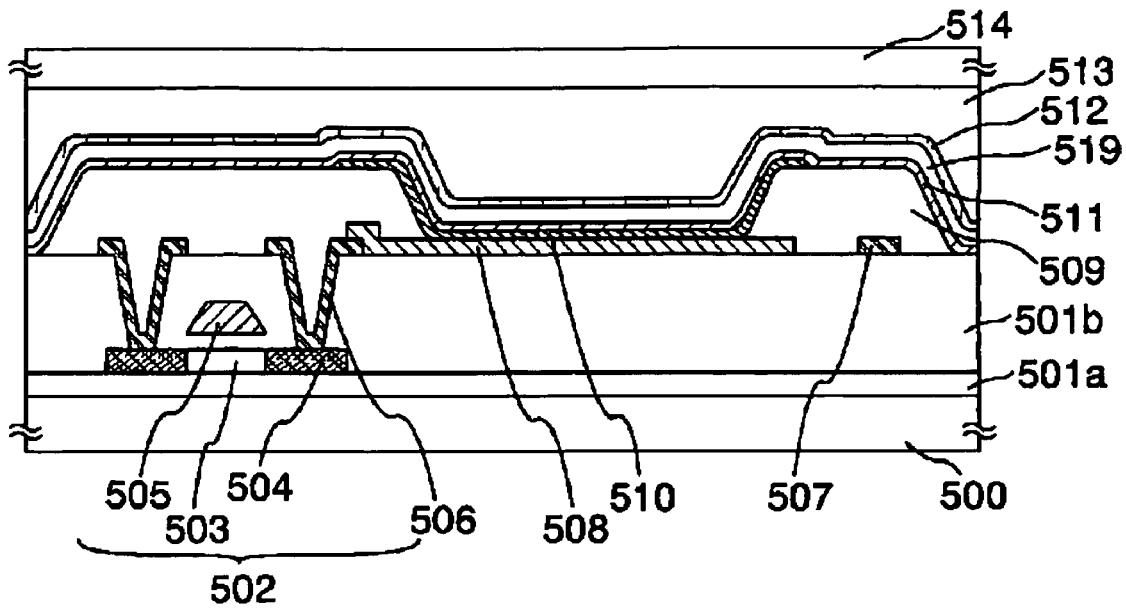
FIG. 15 is a section view showing a TFT and an EL element.
Figure 15:
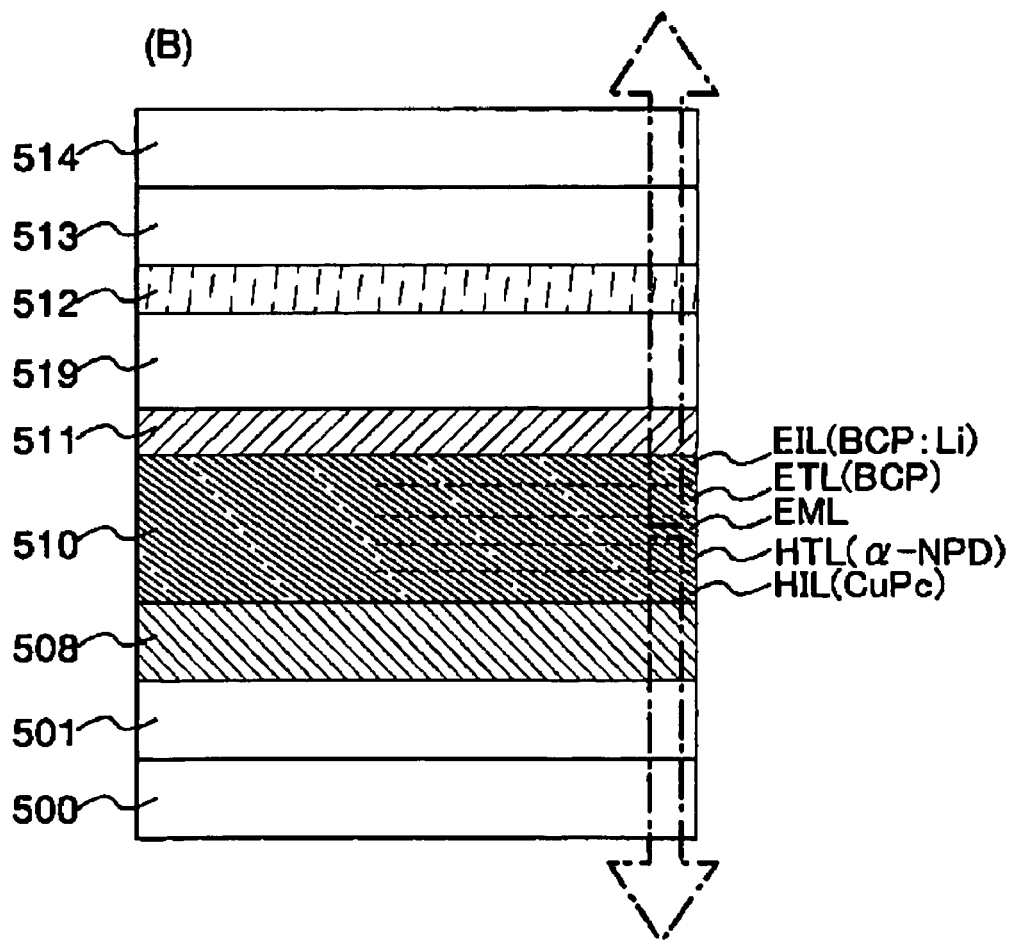

Here, a double-sided light-emitting apparatus (double-sided display panel) in this example will be described with reference to FIG. 15.

FIG. 15(A) is a diagram showing a section of a part of a pixel portion. FIG. 15(B) schematically shows a laminate construction in a light-emitting area. As shown in FIG. 15(B), light can be emitted toward both the upper surface and the lower surface. An arrangement in a light-emitting area, that is, an arrangement of pixel electrodes may be a stripe arrangement, a delta arrangement, a mosaic arrangement or the like.

In FIG. 15(A), 500 is a first substrate, 501, 501a and 501b are insulating layers, 502 is a TFT, 508 is a first electrode (transparent conductive layer), 509 is an insulator (also called wall or bank), 510 is an EL layer, 511 is a second electrode, 512 is a transparent protective layer, 513 is a spacing, 514 is a second substrate and 519 is a transparent conductive layer.

The TFT 502 (p-channel type TFT) over the first substrate 500 is an element for controlling current flowing in the light-emitting EL layer 510. 504 is a drain region (or source region) and 506 is a drain electrode (or source electrode) connecting the first electrode 508 and the drain region (or source region) 504. A wire 507 such as a power supply line and a source wire are formed in the same step for the drain electrode 506. Here, the first electrode 508 and the drain electrode 506 are shown to be provided separately but may be provided integrally. An insulating layer 501a functioning as a primer insulating film (here, including a nitride insulating film as the lower layer and an oxide insulating film as the upper layer) is provided over the first substrate 500. A gate insulating film (not shown) is provided between the gate electrode 505 and an active layer. 501b is an inter-layer insulating film formed of an organic material or an inorganic material. Here, one or plurality of TFTs (n-channel type TFTs or p-channel type TFTs) (not shown) are provided in one pixel additionally. Furthermore, while a TFT having one channel-forming region 503 is shown here, the invention is not particularly limited to its and TFTs of plurality of channels may be used.

In addition, while a top-gate type TFT has been described here, as an example, the invention can be applied to any TFTs regardless of the structures. For example, the invention can be applied to a bottom-gate type (inverted-stagger type) TFT and a forward stagger type TFT.

Reference numeral 508 is a first electrode formed of a transparent conductive film, that is, an anode (or cathode) of the EL element. The transparent conductive film may contain ITO, $In_2O_3$—ZnO, ZnO or the like.

An insulator 509 (also called bank, wall or barrier) is provided so as to cover the end (and the wire 507) of the first electrode 508. The insulator 509 can use an inorganic material (such as silicon oxide, silicon nitride and silicon oxide nitride), a light-sensitive or non-light-sensitive organic material (polyimide, acrylic, polyamide, polyimideamide, resist or benzo-cyclobutene) or the laminate thereof. Here, light-sensitive organic resin covered by a silicon nitride film is used. When positive-type light-sensitive acrylic is used as an organic resin material, the upper end of the insulator preferably has a curved surface having a radius of curvature. The insulator 509 can use either negative type which become insoluble in an etchant with light-sensitive light or positive type which become soluble in an etchant with light.

The layer 510 containing an organic compound is formed by vapor deposition method or coating method. In this example, the organic-compound-contained layer 510 is formed by a vapor deposition apparatus and can have a uniform thickness thereby. In order to improve reliability, degassing is preferably performed by performing vacuum heating (100° C. to 250° C.) immediately before the formation of the organic-compound-contained layer 510. For example, when vapor deposition is used, vapor deposition is performed in a deposition room, which has been vacuum exhausted to the degree of vacuum of $5\times10^{-3}$ Torr (0.665 Pa) or below and, preferably, of $10^{-4}$ to $10^{-6}$ Pa. In the vapor deposition, the organic compound which has been vaporized in advance by resistant heating scatters toward the substrate 500 when a shutter opens. The vaporized organic compound is scattered upward and is deposited to the substrate 500 through an opening in a metal mask.

The EL layer (organic-compound-contained layer) 510 is a laminate of an HIL (hole-injection layer), an HTL (hole transporting layer), an EML (light emitting layer), an ETL (electron transporting layer) and an EIL (electron-injection layer) in that order from the anode side. Representatively, CuPc for HIL, α-NPD for HTL, BCP for ETL and BCP: Li for EIL are used.

As for the EL layer (organic-compound-containing layer) 510, in case for full-color display, layers containing materials specifically emitting red, green and blue light are selectively formed as appropriate by a vapor deposition method using a vapor-deposition mask or an ink-jet method.

Regardless of the above described laminate structure of the EL layer, in order to form the EL layer (organic-compound-contained layer) 510 emitting green light, α-NPD is formed with 60 nm thickness. Then, by using the same vapor-deposition mask, $Alq_3$ containing DMQD as a green light-emitting layer is formed with 40 nm thickness, $Alq_3$ is formed with 40 nm thickness as an electron transporting layer, and $CaF_2$ is formed with 1 nm thickness as an electron injection layer. In order to form the EL layer (organic-compound-contained layer) 510 emitting blue light, α-NPD is formed to be 60 nm thick. Then, by using the same mask, BCP is formed to be 10 nm thick as a blocking layer, $Alq_3$ is formed to be 40 nm thick as an electron transporting layer, and $CaF_2$ is formed to be 1 nm thick as an electron injection layer. In order to form the EL layer (organic-compound-contained layer) 510 emitting red light, α-NPD is formed to be 60 nm thick, and then, by using the same vapor-deposition mask, $Alq_3$ containing DCM as a red light-emitting layer is formed to be 40 nm thick, $Alq_3$ is formed to be 40 nm thick as an electron transporting layer, and $CaF_2$ is formed to be 1 nm thick as an electron injection layer.

For white light emission, a full-color light-emitting display device may be achieved by separately providing a color filter and/or color-converting layer, for example. In order to use a display device for implementing simple display, illumination apparatus, monochrome light emission (typically white light emission) may be adopted. For example, an electron-transporting 1,3,4-oxadiazol derivative (PBD) may be distributed into a hole-transporting polyvinylcarbazole (PVK). White light emission can be obtained by distributing 30 wt % of PBD as an electron transporting agent and distributing appropriate amounts of four kinds of coloring matters (TPB, coumarin6, DCM1 and Nilered). It is also possible to obtain white light emission by being overlapped and mixed an organic compound film emitting red light, an organic compound film emitting green light and an organic compound film emitting blue light, which may be selected as required.

Reference numeral 511 refers to a second electrode formed of a conductive film, that is, a cathode (or an anode) of a light emitting element. As a material of the second electrode 511, an alloy of MgAg, MgIn, AlLi, $CaF_2$ and/or CaN or a metal thin film having a translucency formed by co-evaporation of an element belonging to Group 1 or Group 2 in the periodic table and aluminum. Here, because of the double-sided emission type for emitting light through the second electrode 511, an aluminum film or an aluminum film containing a small amount of Li with the thickness of 6 nm to 10 nm is used. When an Al film is used as the second electrode 511, the material in contact with the organic-compound-contained layer 510 can be formed of a non-oxide material, which can improve the reliability of the light-emitting apparatus. Before the aluminum film is formed to be 6 nm to 10 nm thick, a layer having a translucency (thickness 1 nm to 5 nm) which contains $CaF_2$, $MgF_2$ or $BaF_2$ may be formed as a cathode buffer layer.

In order to give the same transmittance, absorption coefficient and reflectivity to both the light emission from the upper surface and the light emission from the lower surface and also to reduce the resistance of the cathode, the transparent conductive layer 519 (ITO, $In_2O_3$—ZnO, ZnO, etc.) having a thickness range of 240 nm to 290 nm or 380 nm to 500 nm may be formed on the metal thin film of 6 nm to 10 nm thickness. Thus, a difference in tone of display can be reduced between light emission from the upper surface and light emission from the lower surface. In order to reduce the resistance of the cathode, an auxiliary electrode may be provided on the second electrode 511 in a non-light-emitting area. The cathode may be selectively formed by resistance heating by vapor deposition and by using a vapor deposition mask.

Reference numeral 512 refers to a transparent protective layer, which is formed by sputtering or vapor deposition. The transparent protective layer 512 is a sealing film protecting the second electrode 511 including a metal thin film and preventing the entry of water. The transparent protective layer 512 can use a silicon nitride film, silicon oxide film or silicon oxide nitride film (SiNO film (composition rate: N>0) or SiON film (composition rate N<O)) obtained by sputtering or CVD or a thin film mainly containing carbon (such as a DLC film and a CN film). These inorganic insulating films have a high blocking effect against water, but a film stress increases as the thickness increases, which may easily cause peeling of the film.

The transparent protective layer 512 formed in this way is an optimum sealing film for a light emitting element having an organic-compound-contained layer as a light-emitting layer. The second substrate 514 and the first substrate 500 are bonded to each other through a sealing material (not shown) containing a spacing member for establishing a substrate spacing.

As a protective layer, a laminate of a first inorganic insulating film, a stress reducing film and a second inorganic insulating film may be formed on the cathode 511. For example, after the cathode is formed, the first inorganic insulating film may be formed to be 5 nm to 50 nm thick, and the stress reducing film (such as a layer containing an organic component) having hygroscopicity and transparency may be formed to be 10 nm to 100 nm thick by vapor deposition. Furthermore, the second inorganic insulating film may be formed to be 5 nm to 50 nm thick. Also, a laminate of the stress reducing film and the inorganic insulating film may be stacked twice or more.

In this example, as a material for the second substrate 514, a glass substrate, a quartz substrate or a plastic substrate containing Fiberglass-Reinforced Plastics (FRP), polyvinylfloride (PVF), Mylar, polyester, acrylic or the like. While a spacing (inactive gas) 513 is provided between a pair of the substrates in this example, a transparent sealing material may be filled between the pair of the substrates. The sealing material to be filled only needs to be a material having a translucency and is not especially limited. Typically, ultraviolet cure or thermal cure epoxy resin may be used. Here, highly heat-resisting UV epoxy resin (2500Clear by Electrolytes) may be used which has the refractive index of 1.50, the viscosity of 500 cps, the shore D hardness of 90, the tensile strength of 3000 psi, the Tg point at 150° C., the volume resistance of $1\times10^{15}$ Ωcm and the withstand voltage of 450 V/mil. Furthermore, by filling a transparent sealing material between the pair of the substrates, the entire transmittance can be improved, compared to the case where a space (inactive gas) is provided between the pair of the substrates.

This example can be freely combined with the above-described embodiments.

Example 5

A structure of a light emitting element, which is a component of the invention, will be described. The light emitting element corresponds to a laminate of a conductive layer, light-emitting layer and conductive layer over one surface of a substrate having an insulating surface of glass, quartz, metal, an organic substance, and so forth. The light emitting element may be of a laminate type in which a light emitting layer has a plurality of layers, a single-layer type in which a light emitting layer includes one layer, or a mix type in which a light emitting layer includes a plurality of layers but the borders are not clear. The laminate structure of the light emitting element may be a suitable structure selected, in accordance with a conductive type and/or current flow direction of a transistor for driving the light emitting element, from a forward stacking structure in which from the bottom, a conductive layer corresponding to an anode\a light-emitting layer\a conductive layer corresponding to a cathode are stacked, and an inverted stacking structure in which from the bottom a conductive layer corresponding to a cathode\a light-emitting layer\a conductive layer corresponding to a anode, are stacked. The light-emitting layer may contain an organic material (low polymers, high polymers or medium polymers), a material combining an organic material and an inorganic material, a singlet material, a triplet material or a material combining these materials. Light emitted from the light emitting element includes light emitted in the transition from a singlet exciting state to a base state (fluorescence) and light emitted in the transition from a triplet exciting state to the base state (phosphorescence). The invention can use one or both of them. The light emitting element is suitable for moving-image display because of the wide viewing angle, realization of thinness and lightweight based on unnecessity of backlights, and high response speed. Using a display device using the light emitting element can provide high functionality and be high value-addition. This example can be freely combined with the above-described embodiments.

The invention claimed is:

1. A display device comprising:
   a plurality of pixels arranged in a matrix form and a first display screen over one surface of a substrate having a translucency;
   a second display screen over an opposite surface of the substrate that is opposite to the one surface of the substrate, each of the plurality of pixels having a light emitting element for emitting light toward the first display screen and the second display screen, wherein the light emitting element comprises a first electrode and a second electrode both having a translucency, and a light-emitting layer interposed therebetween; and
   a first polarizer over the one surface of the substrate and a second polarizer over the opposite surface of the one surface of the substrate.

2. A display device according to claim 1, wherein an angle formed by the first polarizer and the second polarizer is from 40° to 90°.

3. A display device comprising:
   a plurality of pixels arranged in a matrix form and a first display screen over one surface of a substrate having a translucency;
   a second display screen over an opposite surface of the substrate that is opposite to the one surface of the substrate, each of the plurality of pixels having a light emitting element for emitting light toward the first display screen and the second display screen, wherein the light emitting element comprises a first electrode and a second electrode both having a translucency, and a light-emitting layer interposed therebetween;
one or both of a first ½ wave plate and a first ¼ wave plate and a first polarizer over the one surface of the substrate; and
one or both of a second ½ wave plate and a second ¼ wave plate and a second polarizer over the opposite surface of the substrate.

4. A display device according to claim 3, wherein an angle formed by the first polarizer and the second polarizer is from 40° to 90°.

5. A folding portable terminal comprising:
a first housing having a double-sided display panel and a second housing having operation buttons, the first housing and the second housing being connected through a hinge;
the double-sided display panel having plurality of pixels arranged in a matrix form and a first display screen over one surface of a substrate having a translucency and a second display screen over an opposite surface of the substrate that is opposite to the one surface of the substrate; and
each of the plurality of pixels having a light emitting element which emits light toward the first display screen and the second display screen, wherein the light emitting element comprises a first electrode and a second electrode both having a translucency, and a light-emitting layer interposed therebetween.

6. A folding portable terminal according to claim 5, wherein each of the plurality of pixels has a plurality of transistors controlling the light emitting elements.

7. A folding portable terminal according to claim 5, wherein the first housing includes a microphone and a second housing includes a speaker.

8. A folding portable terminal according to claim 5, wherein the light-emitting layer includes organic compounds emitting red, green and blue light, and
wherein one or more factors selected from transmittances, absorption coefficients and reflectivities of light through the first electrode and light through the second electrode are identical with each other.

9. A folding portable terminal comprising:
a first housing having a double-sided display panel and a second housing having operation buttons, the first housing and the second housing being connected through a hinge;
the double-sided display panel having a plurality of pixels arranged in a matrix form and a first display screen over one surface of a substrate having a translucency and a second display screen over an opposite surface of the substrate that is opposite to the one surface of the substrate;
each of the plurality of pixels having a light emitting element which emits light toward the first display screen and the second display screen, wherein the light emitting element comprises a first electrode and a second electrode both having a translucency, and a light-emitting layer interposed therebetween; and
a first polarizer over the one surface of the substrate and a second polarizer over the opposite surface of the substrate.

10. A folding portable terminal according to claim 9, wherein an angle formed by the first polarizer and the second polarizer is from 40° to 90°.

11. A folding portable terminal according to claim 9, wherein each of the plurality of pixels has a plurality of transistors controlling the light emitting elements.

12. A folding portable terminal according to claim 9, wherein the first housing includes a microphone and a second housing includes a speaker.

13. A folding portable terminal according to claim 9, wherein the light-emitting layer includes organic compounds emitting red, green and blue light, and
wherein one or more factors selected from transmittances, absorption coefficients and reflectivities of light through the first electrode and light through the second electrode are identical with each other.

14. A folding portable terminal comprising:
a first housing having a double-sided display panel and a second housing having operation buttons, the first housing and the second housing being connected through a hinge;
the double-sided display panel having a plurality of pixels arranged in a matrix form and a first display screen over one surface of a substrate having a translucency and a second display screen over an opposite surface of the substrate that is opposite to the one surface of the substrate;
each of the plurality of pixels having a light emitting element which emits light toward the first display screen and the second display screen, wherein the light emitting element comprises a first electrode and a second electrode both having a translucency, and a light-emitting layer interposed therebetween;
one or both of a first ½ wave plate and a first ¼ wave plate and a first polarizer over the one surface of the substrate; and
one or both of a second ½ wave plate and a second ¼ wave plate and a second polarizer over the opposite surface of the substrate.

15. A folding portable terminal according to claim 14, wherein an angle formed by the first polarizer and the second polarizer is from 40° to 90°.

16. A folding portable terminal according to claim 14, wherein each of the plurality of pixels has a plurality of transistors controlling the light emitting elements.

17. A folding portable terminal according to claim 14, wherein the first housing includes a microphone and a second housing includes a speaker.

18. A folding portable terminal according to claim 14, wherein the light-emitting layer includes organic compounds emitting red, green and blue light, and
wherein one or more factors selected from transmittances, absorption coefficients and reflectivities of light through the first electrode and light through the second electrode are identical with each other.

19. A folding portable terminal comprising:
a first housing having a double-sided display panel and a second housing having operation buttons, the first housing and the second housing being connected through a hinge;
the double-sided display panel having a plurality of pixels arranged in a matrix form and a first display screen over one surface of a substrate having a translucency and a second display screen over an opposite surface of the substrate that is opposite to the one surface of the substrate; and
each of the plurality of pixels having a light emitting element emitting light toward the first display screen and the second display screen and an optoelectronic transducer, wherein the light emitting element comprises a first electrode and a second electrode both having a translucency, and a light-emitting layer interposed therebetween.

20. A folding portable terminal according to claim 19, wherein each of the plurality of pixels has a plurality of transistors controlling the light emitting elements.

21. A folding portable terminal according to claim 19, wherein the first housing includes a microphone and a second housing includes a speaker.

22. A folding portable terminal according to claim 19, wherein the light-emitting layer includes organic compounds emitting red, green and blue light, and wherein one or more factors selected from transmittances, absorption coefficients and reflectivities of light through the first electrode and light through the second electrode are identical with each other.

23. A folding portable terminal comprising:

a first housing having a double-sided display panel and a second housing having operation buttons, the first housing and the second housing being connected through a hinge;

the double-sided display panel having a plurality of first pixels arranged in a matrix form and a first display screen over one surface of a substrate having a translucency and a plurality of second pixels arranged in a matrix form and a second display screen over an opposite surface of the substrate that is opposite to the one surface of the substrate; and each of the plurality of first and second pixels having a light emitting element emitting light toward the first display screen and the second display screen, wherein the light emitting element comprises a first electrode and a second electrode both having a translucency, and a light-emitting layer interposed therebetween.

24. A folding portable terminal according to claim 23, wherein each of the plurality of pixels has a plurality of transistors controlling the light emitting elements.

25. A folding portable terminal according to claim 23, wherein the first housing includes a microphone and a second housing includes a speaker.

26. A folding portable terminal according to claim 23, wherein the light-emitting layer includes organic compounds emitting red, green and blue light, and wherein one or more factors selected from transmittances, absorption coefficients and reflectivities of light through the first electrode and light through the second electrode are identical with each other.

27. A folding portable terminal comprising:

a first housing having a plurality of double-sided display panels and a second housing having operation buttons, the first housing and the second housing being connected through a hinge;

each of the plurality of double-sided display panels having plurality of pixels arranged in a matrix form and a first display screen over one surface of a substrate having a translucency and a second display screen over an opposite surface of the substrate that is opposite to the one surface of the substrate; and each of the plurality of pixels having a light emitting element emitting light toward the first display screen and the second display screen, wherein the light emitting element comprises a first electrode and a second electrode both having a translucency, and a light-emitting layer interposed therebetween.

28. A folding portable terminal according to claim 27, wherein each of the plurality of pixels has a plurality of transistors controlling the light emitting elements.

29. A folding portable terminal according to claim 27, wherein the first housing includes a microphone and a second housing includes a speaker.

30. A folding portable terminal according to claim 27, wherein the light-emitting layer includes organic compounds emitting red, green and blue light, and wherein one or more factors selected from transmittances, absorption coefficients and reflectivities of light through the first electrode and light through the second electrode are identical with each other.

31. A folding portable terminal comprising:

a first housing having first to third double-sided display panels and a second housing having operation buttons, the first housing and the second housing being connected through a hinge;

each of the first to third double-sided display panels having a plurality of pixels arranged in a matrix form and a first display screen over one surface of a substrate having a translucency and a second display screen over an opposite surface of the substrate that is opposite to the one surface of the substrate;

each of the plurality of pixels having a light emitting element emitting light toward the first display screen and the second display screen; and the first double-sided display panel having a red display element, the second double-sided display panel having a green display element, and the third double-sided display panel having a blue display element.

32. A folding portable terminal according to claim 31, wherein each of the plurality of pixels has a plurality of transistors controlling the light emitting elements.

33. A folding portable terminal according to claim 31, wherein the first housing includes a microphone and a second housing includes a speaker.

34. A folding portable terminal according to claim 31, wherein the light emitting element has a first electrode having a translucency, a layer including organic compounds emitting red, green and blue light in contact with the first electrode, and a second electrode having a translucency in contact with the layer including the organic compounds, and wherein one or more factors selected from transmittances, absorption coefficients and reflectivities of light through the first electrode and light through the second electrode are identical with each other.

* * * * *